(12) United States Patent
Fukumitsu et al.

(10) Patent No.: US 12,365,583 B2
(45) Date of Patent: Jul. 22, 2025

(54) RESONANCE DEVICE WITH SUBSTRATE HAVING OXIDE FILM CONTAINING THROUGH HOLE AND METAL THERIN, AND MANUFACTURING METHOD THEREFOR

(71) Applicant: Murata Manufacturing Co., Ltd., Nagaokakyo (JP)

(72) Inventors: Masakazu Fukumitsu, Nagaokakyo (JP); Yoshiyuki Higuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 795 days.

(21) Appl. No.: 17/401,744

(22) Filed: Aug. 13, 2021

(65) Prior Publication Data

US 2021/0371273 A1    Dec. 2, 2021

Related U.S. Application Data

(63) Continuation of application No. PCT/JP2019/040421, filed on Oct. 15, 2019.

(30) Foreign Application Priority Data

Mar. 26, 2019   (JP) .................................. 2019-058267

(51) Int. Cl.
  *B81C 1/00*      (2006.01)
  *H03H 3/007*     (2006.01)
  *H10N 30/00*     (2023.01)

(52) U.S. Cl.
  CPC ....... *B81C 1/00301* (2013.01); *H03H 3/0072* (2013.01); *H10N 30/706* (2024.05);
  (Continued)

(58) Field of Classification Search
  CPC ...... B81B 2207/096; B81B 2201/0271; B81B 2203/0315; B81B 2207/097;
  (Continued)

(56) References Cited

U.S. PATENT DOCUMENTS

| 6,541,301 B1* | 4/2003 | Raymond ............. H01L 23/481 |
| | | 257/E21.597 |
| 2009/0135541 A1* | 5/2009 | Kawakubo ............. H02N 1/006 |
| | | 361/290 |

(Continued)

FOREIGN PATENT DOCUMENTS

| JP | 2011061416 A | 3/2011 |
| WO | 2015098679 A1 | 7/2015 |

(Continued)

OTHER PUBLICATIONS

International Search Report issued for PCT/JP2019/040421, date of mailing Nov. 26, 2019.

(Continued)

*Primary Examiner* — David Chen
(74) *Attorney, Agent, or Firm* — ArentFox Schiff LLP

(57) ABSTRACT

A resonance device that includes a MEMS substrate that includes a resonator, a top cover having a silicon oxide film on a surface thereof that faces the MEMS substrate, and a bonding part that bonds the MEMS substrate and the top cover to each other so as to seal a vibration space of the resonator. The silicon oxide film includes a through hole that is formed along at least part of the periphery of the vibration space when the top cover is viewed in a plan view and that penetrates to a surface of the top cover. The through hole includes a first metal layer.

18 Claims, 17 Drawing Sheets

(52) U.S. Cl.
CPC . *B81B 2201/0271* (2013.01); *B81B 2207/093* (2013.01); *B81B 2207/095* (2013.01)

(58) Field of Classification Search
CPC ............ B81B 2207/094; B81B 3/0018; B81B 7/0064; B81B 7/0058; B81B 2207/093; B81B 2207/095; H01L 2924/1461; H03H 3/0072; H03H 9/2405; H03H 9/0595; H03H 9/1057; H03H 9/2489; B81C 1/00301; B81C 1/00269; B81C 2203/0109; H10N 30/706
USPC .............. 257/254, 415, 690, 21.499, 21.506, 257/29.324; 438/51, 106
See application file for complete search history.

(56) References Cited

U.S. PATENT DOCUMENTS

| | | | | |
|---|---|---|---|---|
| 2013/0043547 A1* | 2/2013 | Chu | .................... | B81C 1/00238 257/E21.705 |
| 2013/0140651 A1* | 6/2013 | Chen | ...................... | H10N 30/88 257/415 |
| 2014/0264744 A1* | 9/2014 | Chu | .................... | H01L 27/0629 257/532 |
| 2015/0375994 A1* | 12/2015 | Chien | ................ | B81C 1/00238 257/43 |
| 2016/0294354 A1 | 10/2016 | Saijo et al. | | |
| 2017/0252855 A1 | 9/2017 | Fukumitsu et al. | | |
| 2017/0338216 A1* | 11/2017 | De Winter | ............ | H01L 23/367 |
| 2018/0069048 A1* | 3/2018 | Wu | ..................... | G06V 40/1318 |
| 2018/0127268 A1 | 5/2018 | Fukumitsu et al. | | |
| 2019/0089321 A1 | 3/2019 | Morinaga | | |
| 2020/0027783 A1* | 1/2020 | Kim | .................. | H01L 21/76877 |

FOREIGN PATENT DOCUMENTS

| | | |
|---|---|---|
| WO | 2016080506 A1 | 5/2016 |
| WO | 2017047663 A1 | 3/2017 |
| WO | 2017212677 A1 | 12/2017 |

OTHER PUBLICATIONS

Written Opinion of the International Searching Authority issued for PCT/JP2019/040421, date of mailing Nov. 26, 2019.

* cited by examiner

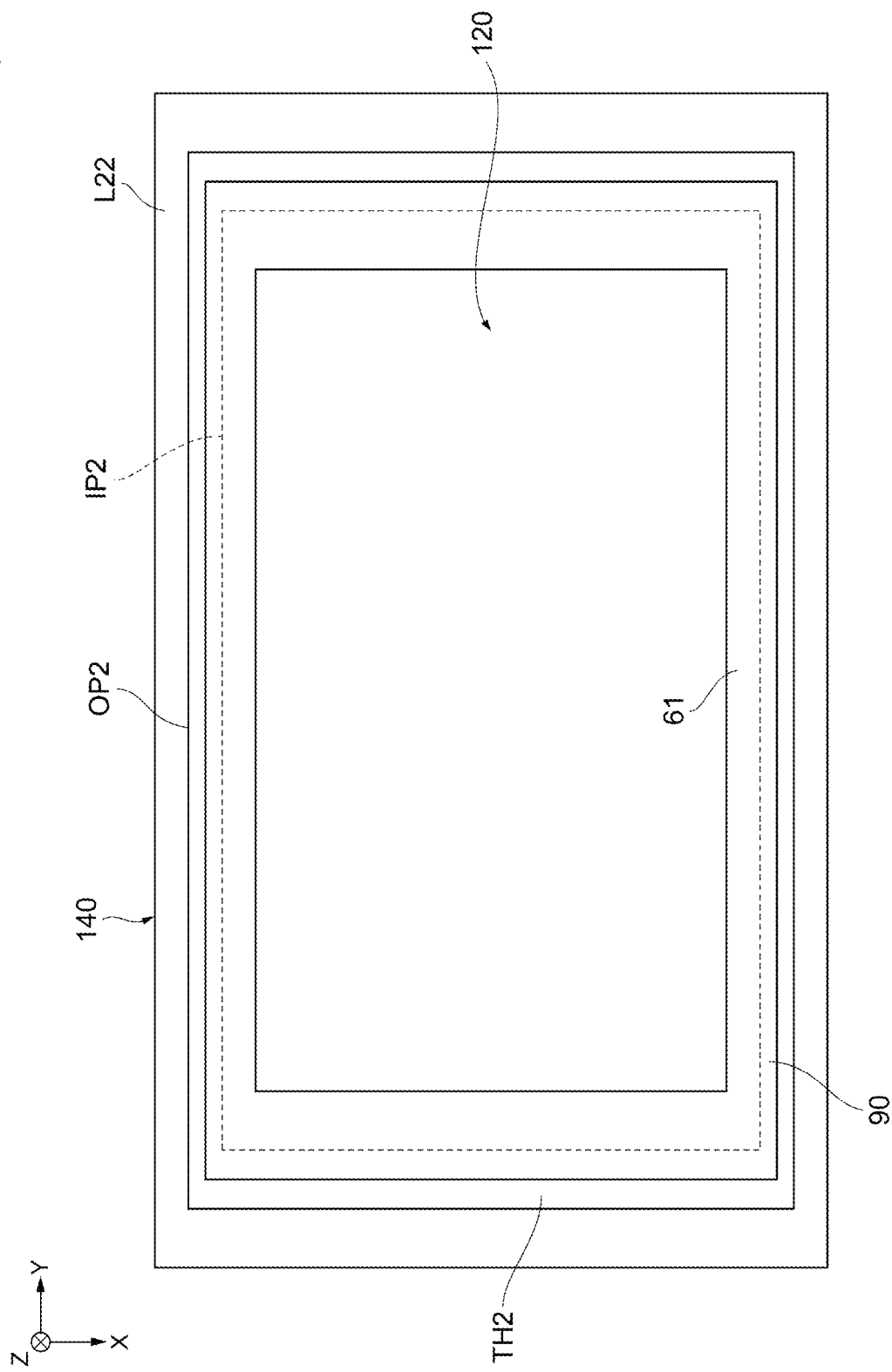

RESONANCE DEVICE WITH SUBSTRATE HAVING OXIDE FILM CONTAINING THROUGH HOLE AND METAL THERIN, AND MANUFACTURING METHOD THEREFOR

CROSS REFERENCE TO RELATED APPLICATIONS

The present application is a continuation of International application No. PCT/JP2019/040421, filed Oct. 15, 2019, which claims priority to Japanese Patent Application No. 2019-058267, filed Mar. 26, 2019, the entire contents of each of which are incorporated herein by reference.

FIELD OF THE INVENTION

The present invention relates to a resonance device and a resonance device manufacturing method.

BACKGROUND OF THE INVENTION

Heretofore, resonance devices manufactured using micro electromechanical systems (MEMS) technologies have been widely used. This kind of device is, for example, formed by bonding an upper substrate to a lower substrate that is equipped with a resonator.

For example, Patent Document 1 discloses a wafer bonding method that includes a step of preparing a first wafer having a first metal layer that has a first rigidity formed on a surface thereof and a second wafer having a second metal layer that has a second rigidity that is higher than the first rigidity formed on a surface thereof, a step removing an oxide film from a surface of the second metal layer while not removing an oxide film from a surface of the first metal layer, and a step of bonding the surface of the first wafer and the surface of the second wafer to each other. In addition, Patent Document 1 discloses, as a method for fixing an upper substrate to the top of a support frame of a piezoelectric resonator around the periphery of the upper substrate, that the piezoelectric resonator and the upper substrate are bonded to each other through eutectic bonding of a first metal layer formed of a metal having aluminum (Al) as a main component and a second metal layer formed of a metal having germanium (Ge) as a main component.

Patent Document 1: International Publication No. 2016/080506

SUMMARY OF THE INVENTION

In the case of eutectic bonding of aluminum (Al) and germanium (Ge) as disclosed in Patent Document 1, when a eutectic layer is formed on a silicon substrate, silicon (Si) diffuses into the eutectic layer. Therefore, a method has been proposed for suppressing diffusion of silicon into the eutectic layer by forming an oxide film such as a silicon dioxide ($SiO_2$) film on the silicon substrate.

However, it is known that an oxide film such as a silicon dioxide ($SiO_2$) film allows a gas such as helium to pass therethrough. Therefore, the degree of vacuum of a vibration space of a resonator may be reduced due to entry of helium gas from the oxide film in an environment in which helium gas is present. As a result of the degree of vacuum being reduced, there is a risk of the vibration characteristics such as the Q value of a resonator inside a device being degraded.

The present invention was made in light of the above-described circumstances and it is an object thereof to provide a resonance device and a resonance device manufacturing method that enable a reduction in the degree of vacuum in the vibration space of a resonator to be suppressed.

A resonance device according to an aspect of the present invention includes: a first substrate that includes a resonator; a second substrate that includes a first oxide film on a surface thereof that faces the first substrate; and a bonding part that bonds the first substrate and the second substrate to each other so as to seal a vibration space of the resonator. The first oxide film includes a first through hole along at least part of a periphery of the vibration space when the second substrate is viewed in plan view of the resonance device, the through hole penetrating to the surface of the second substrate, and the first through hole includes a first metal therein.

A resonance device manufacturing method according to another aspect of the present invention includes: preparing a first substrate that includes a resonator; preparing a second substrate that includes a first oxide film on a surface thereof; forming, in the first oxide film, a first through hole that penetrates to a surface of the first substrate along at least part of a periphery of a vibration space of the resonator when the second substrate is viewed in a plan view thereof; forming a first metal in the first through hole; and bonding the first substrate and the second substrate to each other such that the first oxide film faces the first substrate and so as to seal the vibration space of the resonator.

According to the present invention, a reduction in the degree of vacuum of a vibration space of a resonator can be suppressed.

BRIEF DESCRIPTION OF THE DRAWINGS

FIG. 17 is a plan view schematically illustrating the configuration when a surface of a MEMS substrate in the Third Modification is viewed in plan view.

DETAILED DESCRIPTION OF THE PREFERRED EMBODIMENTS

Hereafter, embodiments of the present invention will be described. In the following description of the drawings, identical or similar constituent elements are denoted by identical or similar reference symbols. The drawings are representative, the dimensions and shapes of the individual parts are schematically illustrated, and the technical scope of the present invention should not be interpreted as being limited to that of the embodiments.

Embodiments

Figure 1:
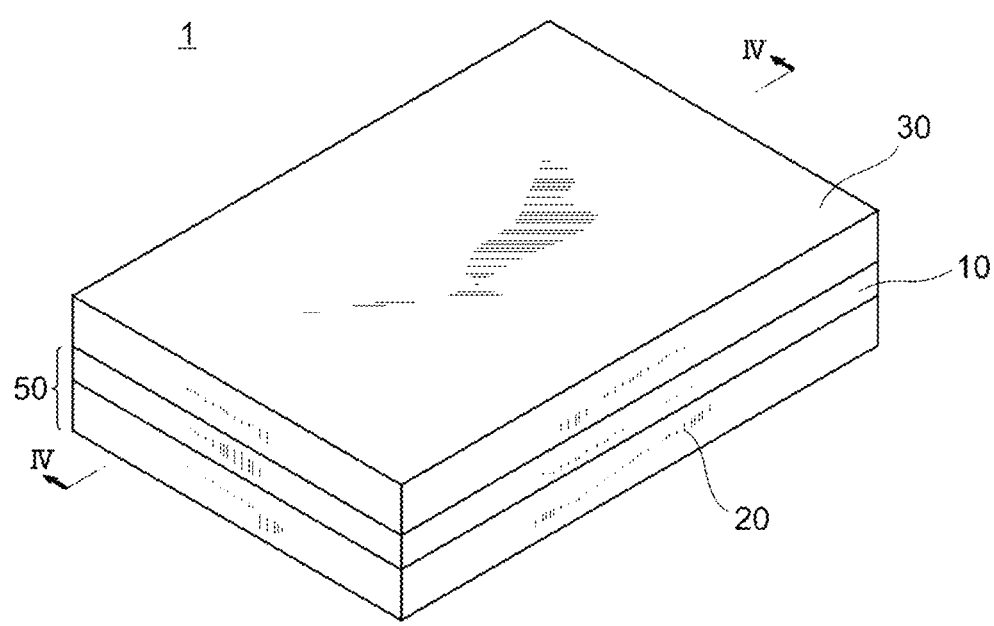
FIG. 1 is a perspective view schematically illustrating the exterior of a resonance device according to an embodiment of the present invention.
Figure 2:
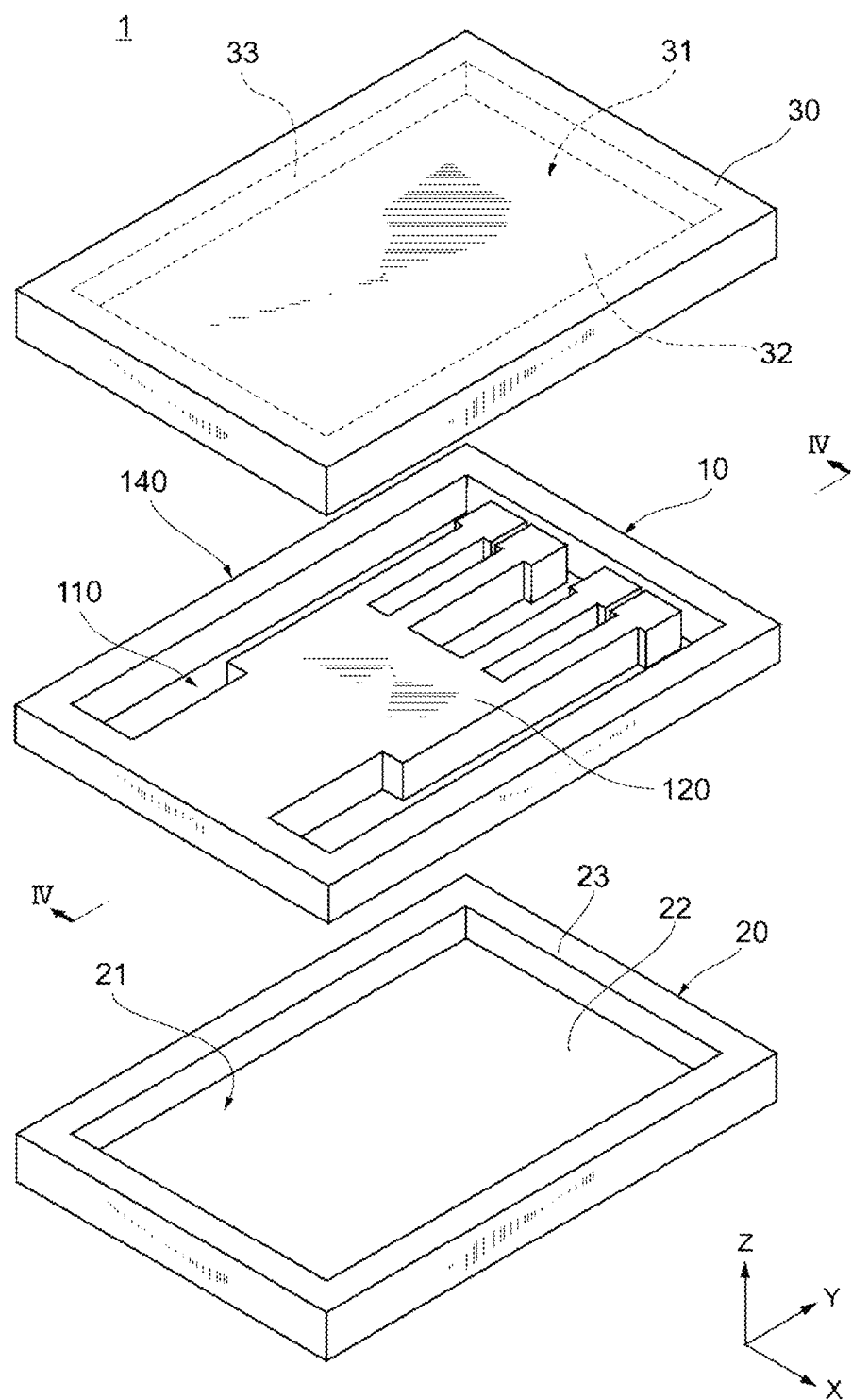
FIG. 2 is an exploded perspective view schematically illustrating the structure of the resonance device illustrated in FIG. 1.

First, the basic configuration of a resonance device according to an embodiment of the present invention will be described while referring to FIGS. 1 and 2. FIG. 1 is a perspective view schematically illustrating the exterior of a resonance device 1 according to the embodiment of the present invention. FIG. 2 is an exploded perspective view schematically illustrating the structure of the resonance device 1 illustrated in FIG. 1.

The resonance device 1 includes a bottom cover 20, a resonator 10 (hereafter, the bottom cover 20 and the resonator 10 are also collectively referred to as a "MEMS substrate 50"), and a top cover 30. In other words, the resonance device 1 is formed by stacking the MEMS substrate 50, a bonding part 60, and the top cover 30 in this order. The MEMS substrate 50 corresponds to an example of a "first substrate" of the present description and the top cover 30 corresponds to an example of a "second substrate" of the present description.

Hereafter, the configuration of each part of the resonance device 1 will be described. Note that in the following description, the side of the resonance device 1 where the top cover 30 is provided is referred to as "top" (or "front") and the side of the resonance device 1 where the bottom cover 20 is provided is referred to as "bottom" (or "rear").

The resonator 10 is a MEMS vibrator manufactured using a MEMS technology. The resonator 10 and the top cover 30 are bonded to each other by the bonding part 60, which is described later. In addition, the resonator 10 and the bottom cover 20 are each formed using a silicon (Si) substrate (hereafter also referred to as a "Si substrate") and these Si substrates are bonded to each other. The MEMS substrate 50 (resonator 10 and bottom cover 20) may be formed using an SOI substrate.

The top cover 30 extends in a flat plate shape along the XY plane and a recess 31, which for example has a flat rectangular parallelepiped shape, is formed in the rear surface of the top cover 30. The recess 31 is surrounded by a side wall 33 and the recess 31 forms part of a vibration space, which is a space in which the resonator 10 vibrates. In addition, a getter layer 34, which is described later, is formed on a surface of the recess 31, which is on the side near the resonator 10, of the top cover 30. The top cover 30 may instead be configured as a flat plate without the recess 31.

The bottom cover 20 includes a rectangular flat plate shaped bottom plate 22, which is provided along the XY plane, and a side wall 23 which extends in the Z axis direction from the periphery of the bottom plate 22, i.e., in the direction in which the bottom cover 20 and the resonator 10 are stacked. A recess 21, which is formed by the front surface of the bottom plate 22 and the inner surface of the side wall 23, is formed in the surface of the bottom cover 20 that faces the resonator 10. The recess 21 forms part of the vibration space of the resonator 10. The bottom cover 20 may instead be configured as a flat plate without the recess 21. In addition, a getter layer may be formed on the surface of the recess 21, which is on the side near the resonator 10, of the bottom cover 20.

Figure 3:
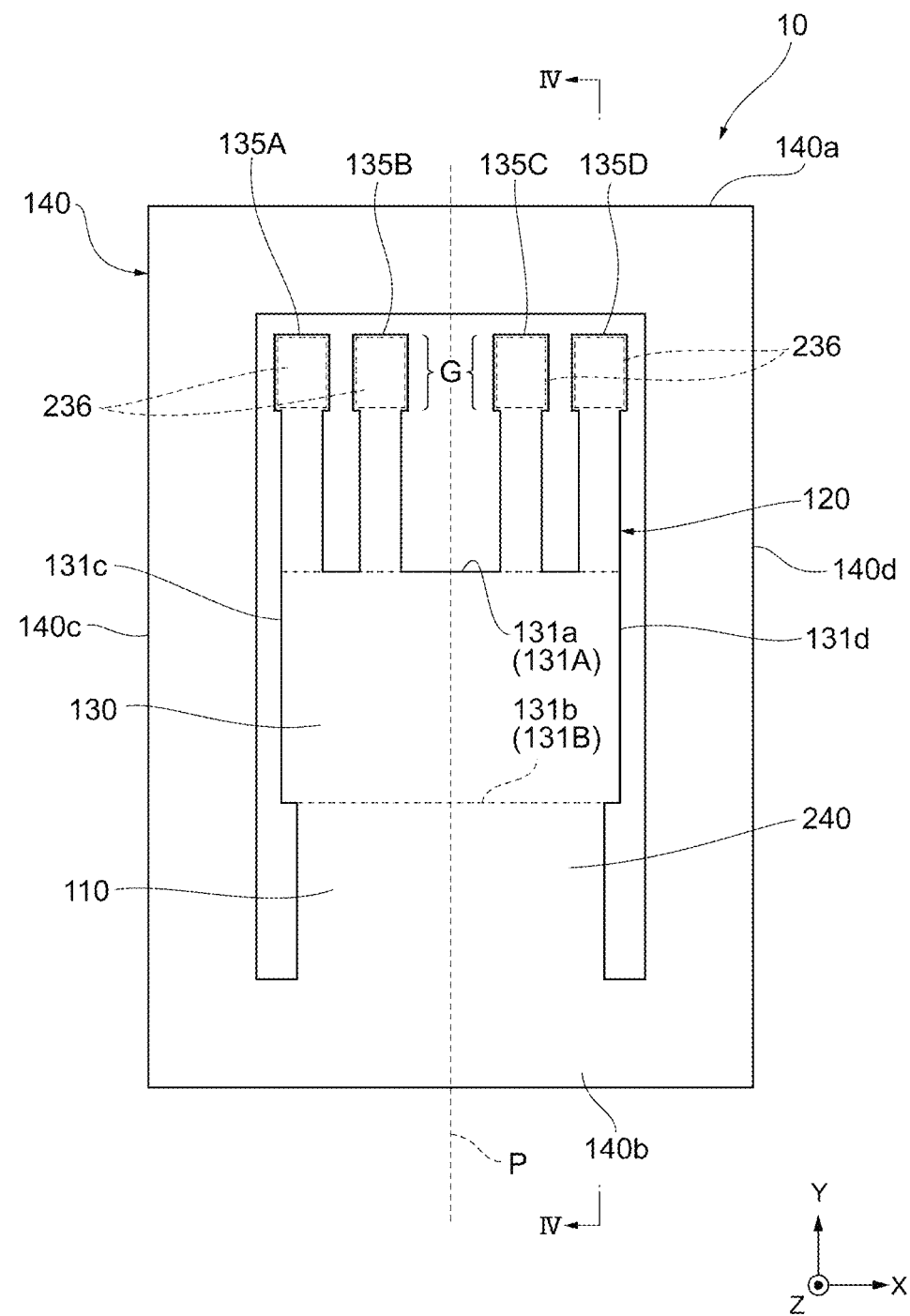
FIG. 3 is a plan view schematically illustrating the structure of a resonator illustrated in FIG. 2.

Next, the basic configuration of the resonator 10 according to the embodiment of the present invention will be described while referring to FIG. 3. FIG. 3 is a plan view schematically illustrating the structure of the resonator 10 illustrated in FIG. 2.

As illustrated in FIG. 3, the resonator 10 is a MEMS vibrator manufactured using MEMS technology and undergoes out-of-plane vibration in the XY plane in the Cartesian coordinate system in FIG. 3. Note that the resonator 10 does not have to be a resonator using an out-of-plane bending vibration mode. The resonator of the resonance device 1 may, for example, use a spreading vibration mode, a thickness longitudinal vibration mode, a Lamb wave vibration mode, an in-plane bending vibration mode, or a surface acoustic wave vibration mode. These vibrators are applied, for example, to timing devices, RF filters, duplexers, ultrasonic transducers, gyroscopic sensors, accelerometers, and so forth. Furthermore, the vibrators may also be used in piezoelectric mirrors having actuator functions, piezoelectric gyros, piezoelectric microphones having pressure sensor functions, ultrasonic vibration sensors, and so on. In addition, the vibrators may be applied to electrostatic MEMS elements, electromagnetic driving MEMS elements, and piezo-resistance MEMS elements.

The resonator 10 includes a vibrating portion 120, a holding portion 140, and a holding arm 110.

The holding portion 140 is formed in a rectangular frame shape so as to surround the outside of the vibrating portion 120 along the XY plane. For example, the holding portion 140 is integrally formed from a prism-shaped frame. Note that it is sufficient that the holding portion 140 be provided along at least part of the periphery of the vibrating portion 120 and the holding portion 140 is not limited to having a frame-like shape.

The holding arm 110 is provided on the inner side of the holding portion 140 and connects the vibrating portion 120 and the holding portion 140 to each other.

The vibrating portion 120 is provided on the inner side of the holding portion 140 and a space is formed between the vibrating portion 120 and the holding portion 140 with a predetermined spacing. In the example illustrated in FIG. 3, the vibrating portion 120 includes a base portion 130 and four vibrating arms 135A to 135D (hereafter, also collectively referred to as "vibrating arms 135"). Note that the number of vibrating arms is not limited to four and a desired number of vibrating arms such as one or more may be provided. In this embodiment, the vibrating arms 135A to 135D and the base portion 130 are formed so as to be integrated with each other.

In plan view, the base portion 130 has long sides 131a and 131b that extend in the X axis direction and short sides 131c and 131d that extend in the Y axis direction. The long side 131a is one side of the surface of the front end of the base portion 130 (hereafter, also referred to as "front end 131A") and the long side 131b is one side of the surface of the rear end of the base portion 130 (hereafter, referred to as "rear end 131B"). The front end 131A and the rear end 131B of the base portion 130 are provided so as to face each other.

The base portion 130 is connected to the vibrating arms 135 at the front end 131A and is connected to the holding arm 110, which is described later, at the rear end 131B. The base portion 130 has a substantially rectangular shape in plan view in the example illustrated in FIG. 3, but is not limited to this shape. It is sufficient that the base portion 130 be formed so as to substantially have planar symmetry with respect to a virtual plane P defined along a vertical bisector of the long side 131a. For example, the base portion 130 may have a trapezoidal shape in which the long side 131b is shorter than the long side 131a or the base portion 130 may have a semi-circular shape in which the long side 131a is the diameter. Furthermore, the surfaces of the base portion 130 are not limited to being flat surfaces and may be curved surfaces. The virtual plane P is a plane that extends through the center, in the direction in which the vibrating arms 135 are arrayed, of the vibrating portion 120.

In the base portion 130, a base portion length, which is the longest distance between the front end 131A and the rear end 131B in the direction from the front end 131A to the rear end 131B, is around 35 μm. Furthermore, a base portion width, which is the longest distance between side edges of the base portion 130 in a width direction perpendicular to the base portion length direction, is around 265 μm.

The vibrating arms 135 extend in the Y axis direction and have the same size as each other. The vibrating arms 135 are provided parallel to the Y axis direction between the base portion 130 and the holding portion 140 and first ends thereof are fixed ends that are connected to the front end 131A of the base portion 130 and second ends thereof are open ends. In addition, the vibrating arms 135 are provided parallel to each other with a prescribed interval therebetween in the X axis direction. The vibrating arms 135, for example, have a width of around 50 μm in the X axis direction and a length of around 465 μm in the Y axis direction.

Part of each vibrating arm 135 extending around 150 μm from the open end is wider in the X axis direction than the other part of the vibrating arm 135. This wider part is called a weight portion G. Each weight portion G is, for example, 10 μm wider on each side in the X-axis direction than the other portion of the vibrating arm 135 and has a width of around 70 μm in the X-axis direction. The weight portions G are integrally formed using the same process as for the vibrating arms 135. As a result of forming the weight portions G, the vibrating arms 135 have a higher weight per unit length at the open ends thereof than at the fixed ends thereof. Therefore, the amplitude of the vibration in the vertical direction in each vibrating arm can be increased due to each of the vibrating arms 135 having the weight portion G at the open end thereof.

A protective film 235, which is described later, is formed so as to cover the entire front surface of the vibrating portion 120 (the surface facing the top cover 30). In addition, a frequency-adjusting film 236 is formed on the front surface of the protective film 235 on the tips, on the open-end side, of the vibrating arms 135A to 135D. The resonant frequency of the vibrating portion 120 can be adjusted using the protective film 235 and the frequency-adjusting film 236.

In this embodiment, substantially the entirety of the front surface of the resonator 10 (surface on the side facing the top cover 30) is covered by the protective film 235. In addition, substantially the entire front surface of the protective film 235 is covered by a parasitic capacitance reducing film 240. However, it is sufficient that the protective film 235 cover at least the vibrating arms 135 and the protective film 235 is not limited to being formed so as to cover substantially the entire surface of the resonator 10.

Figure 4:
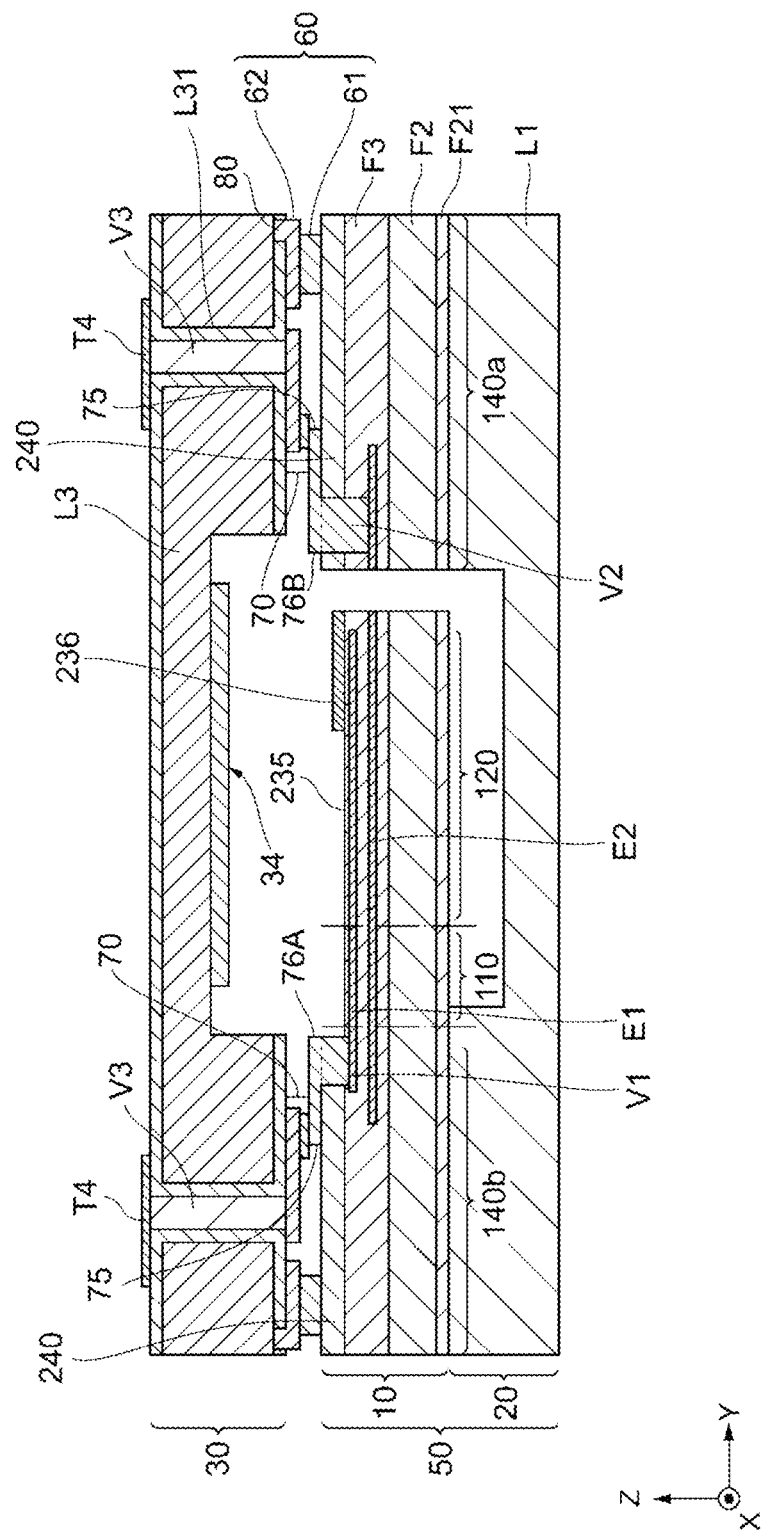
FIG. 4 is a sectional view schematically illustrating the configuration of a cross section of the resonance device illustrated in FIGS. 1 to 3 taken along the line IV-IV.

Next, the multilayer structure of the resonance device 1 according to the embodiment of the present invention will be described while referring to FIG. 4. FIG. 4 is a sectional view schematically illustrating the configuration of a cross section of the resonance device 1 illustrated in FIGS. 1 to 3 taken along the line IV-IV.

As illustrated in FIG. 4, in the resonance device 1, the holding portion 140 of the resonator 10 is bonded to the top of the side wall 23 of the bottom cover 20 and furthermore, the holding portion 140 of the resonator 10 and the side wall 33 of the top cover 30 are bonded to each other. Thus, the resonator 10 is held between the bottom cover 20 and the top cover 30 and a vibration space in which the vibrating arms 135 vibrate is formed by the bottom cover 20, the top cover 30, and the holding portion 140 of the resonator 10. In addition, a terminal T4 is formed on the top surface of the top cover 30 (surface on opposite side from surface facing resonator 10). The terminal T4 and the resonator 10 are electrically connected to each other by a through electrode V3, a connection wiring line 70, and contact electrodes 76A and 76B.

The top cover 30 is formed of a Si substrate L3 having a prescribed thickness. The top cover 30 is bonded to the holding portion 140 of the resonator 10 by the bonding part 60, which is described later, along the periphery (side wall 33) thereof. The surface of the top cover 30 facing the resonator 10 is covered by a silicon oxide film L31. The silicon oxide film L31 is, for example, composed of silicon dioxide ($SiO_2$) and is formed on the surface of the Si substrate L3 by oxidizing the surface of the Si substrate L3 or by performing chemical vapor deposition (CVD). It is preferable that the rear surface of the top cover 30 and the side surface of the through electrode V3 also be covered by the silicon oxide film L31.

In addition, a getter layer 34 is formed on the surface of the recess 31, which is on the side facing the resonator 10, of the top cover 30. The getter layer 34 is, for example, formed of titanium (Ti) and absorbs outgas generated in the vibration space. As a result of forming the getter layer 34 over substantially the entire surface of the recess 31, on the side facing the resonator 10, in the top cover 30 according to this embodiment, it is possible to suppress a decrease in the degree of vacuum of the vibration space.

Furthermore, the through electrode V3 of the top cover 30 is formed by filling a through hole formed in the top cover 30 with an electrically conductive material. The filled electrically conductive material is, for example, impurity-doped polycrystalline silicon (Poly-Si), copper (Cu), gold (Au), or impurity-doped monocrystalline silicon. The through electrode V3 serves as a wiring line that electrically connects the terminal T4 and a voltage application part 141 to each other.

The bottom plate 22 and the side wall 23 of the bottom cover 20 are integrally formed by a Si wafer L1. In addition, the bottom cover 20 is bonded to the holding portion 140 of the resonator 10 by the top surface of the side wall 23. The thickness of the bottom cover 20 defined in the Z axis direction is, for example, 150 µm and the depth of the recess 21 is, for example, 50 µm. In addition, the Si wafer L1 is formed of non-degenerate silicon and the resistivity thereof is 16 mΩ·cm or higher, for example.

The holding portion 140, the base portion 130, the vibrating arms 135, and the holding arm 110 of the resonator 10 are integrally formed with each other using the same process. In the resonator 10, a piezoelectric thin film F3 is formed on a Si substrate F2, which is an example of a substrate, so as to cover the Si substrate F2, and furthermore, a metal layer E2 is stacked on the piezoelectric thin film F3. In addition, the piezoelectric thin film F3 is stacked on the metal layer E2 so as to cover the metal layer E2, and furthermore, a metal layer E1 is stacked on the piezoelectric thin film F3. The protective film 235 is stacked on the metal layer E1 so as to cover the metal layer E1 and the parasitic capacitance reducing film 240 is stacked on the protective film 235.

The Si substrate F2 is formed of a degenerate n-type silicon (Si) semiconductor having a thickness of around 6 µm, for example, and can contain phosphorus (P), arsenic (As), antimony (Sb), and the like as n-type dopants. The resistance of the degenerate silicon (Si) used in the Si substrate F2 is, for example, less than 16 mΩ·cm and more preferably is 1.2 mΩ·cm or less. In addition, as an example of a temperature characteristic correcting layer, a silicon oxide layer F21, which is for example composed of silicon dioxide ($SiO_2$), is formed on the bottom surface of the Si substrate F2. This enables the temperature characteristics to be improved. Note that the silicon oxide layer F21 may instead be formed on the top surface of the Si substrate F2 or may be formed on both the top surface and the bottom surface of the Si substrate F2.

In addition, the metal layers E1 and E2, for example, have a thickness of around 0.1 µm to 0.2 µm and are patterned into desired shapes using etching or the like after being deposited. Metals having a body-centered cubic crystal structure are used for the metal layers E1 and E2. Specifically, the metal layers E1 and E2 are formed using molybdenum (Mo), tungsten (W), or the like.

The metal layer E1 is, for example, formed on the vibrating portion 120 so as to serve as an upper electrode. In addition, the metal layer E1 is formed on the holding arm 110 and the holding portion 140 so as to serve as a wiring line for connecting the upper electrode to an AC power source provided outside the resonator 10.

On the other hand, the metal layer E2 is formed on the vibrating portion 120 so as to serve as a lower electrode. Furthermore, the metal layer E2 is formed on the holding arm 110 and the holding portion 140 so as to serve as a wiring line for connecting the lower electrode to a circuit provided outside the resonator 10.

The piezoelectric thin film F3 is a thin film composed of a piezoelectric material that converts voltages applied thereto into vibrations. The piezoelectric thin film F3 is formed of a material having a wurtzite-type hexagonal crystal structure and for example can have a nitride or an oxide as a main constituent such as aluminum nitride (AlN), scandium aluminum nitride (ScAlN), zinc oxide (ZnO), gallium nitride (GaN), or indium nitride (InN). Scandium aluminum nitride is a substance obtained by replacing some of the aluminum in aluminum nitride with scandium, and instead of scandium, the aluminum may be replaced with two elements such as magnesium (Mg) and niobium (Nb) or magnesium (Mg) and zirconium (Zr). In addition, the piezoelectric thin film F3 has, for example, a thickness of 1 µm, but a thickness of around 0.2 µm to 2 µm may be used.

The piezoelectric thin film F3 expands and contracts in in-plane directions in the XY plane, i.e., in the Y axis direction, in accordance with an electric field applied to the piezoelectric thin film F3 by the metal layers E1 and E2. The free ends of the vibrating arms 135 are displaced toward the inner surfaces of the bottom cover 20 and the top cover 30 by the expansion and contraction of the piezoelectric thin film F3 and the vibrating arms 135 vibrate in an out-of-plane bending vibration mode.

In this embodiment, the phase of the electric field applied to the outer vibrating arms 135A and 135D and the phase of the electric field applied to the inner vibrating arms 135B and 135C are set so as to be opposite phases. This causes the outer vibrating arms 135A and 135D and the inner vibrating arms 135B and 135C to be displaced in opposite directions from each other. For example, when the free ends of the outer vibrating arms 135A and 135D are displaced toward the inner surface of the top cover 30, the free ends of the inner vibrating arms 135B and 135C are displaced toward the inner surface of the bottom cover 20.

The protective film 235 prevents oxidation of the metal layer E2, which is an upper electrode used for inducing piezoelectric vibrations. The protective film 235 is preferably formed of a material having a lower speed of mass reduction by etching than the frequency-adjusting film 236. The speed of mass reduction is expressed by the etching speed, i.e., the product of the thickness removed per unit time and the density. The protective film 235 is, for example, formed of a piezoelectric film composed of aluminum nitride (AlN), scandium aluminum nitride (ScAlN), zinc oxide (ZnO), gallium nitride (GaN), indium nitride (InN), or the like or an insulating film composed of silicon nitride (SiN), silicon oxide ($SiO_2$), alumina oxide ($Al_2O_3$), or the like. The thickness of the protective film 235 is, for example, around 0.2 µm.

The frequency-adjusting film 236 is formed only on prescribed regions by performing etching or the like after forming the frequency-adjusting film 236 over substantially the entire surface of the vibrating portion 120. The frequency-adjusting film 236 is formed of a material having a higher speed of mass reduction by etching than the protective film 235. Specifically, the frequency-adjusting film 236 is formed of a metal such as molybdenum (Mo), tungsten (W), gold (Au), platinum (Pt), nickel (Ni), or titanium (Ti).

Note that so long as the relationship between the mass reduction speeds of the protective film 235 and the frequency-adjusting film 236 is as described above, the relationship between the magnitudes of the etching speeds may be set as desired.

The parasitic capacitance reducing film 240 is formed of tetraethyl orthosilicate (TEOS). The thickness of the parasitic capacitance reducing film 240 is around 1 µm. As well as reducing parasitic capacitances at lead-out wiring parts, the parasitic capacitance reducing film 240 functions as an insulating layer for when wiring lines of different potentials cross each other and functions as a stand off film for increasing the vibration space.

The connection wiring line 70 is electrically connected to the terminal T4 via the through electrode V3 and is electrically connected to the contact electrodes 76A and 76B.

The contact electrode 76A is formed so as to contact the metal layer E1 of the resonator 10 and electrically connects the connection wiring line 70 and the resonator 10 to each other. The contact electrode 76B is formed so as to contact the metal layer E2 of the resonator 10 and electrically connects the connection wiring line 70 and the resonator 10 to each other. Specifically, when connecting the contact electrode 76A and the metal layer E1 to each other, a portion of each of the piezoelectric film F3, the protective film 235, and the parasitic capacitance reducing film 240 stacked on the metal layer E1 is removed in order to expose the metal layer E1 and a via V1 is formed. The inside of the formed via V1 is filled with the same material as the contact electrode 76A and the metal layer E1 and the contact electrode 76A are connected to each other. Similarly, when connecting the contact electrode 76B and the metal layer E2 to each other, portions of the piezoelectric film F3 and the parasitic capacitance reducing film 240 stacked on the metal layer E2 are removed in order to expose the metal layer E2 and a via V2 is formed. The inside of the formed via V2 is filled with the contact electrode 76B and the metal layer E2 and the contact electrode 76B are connected to each other. The contact electrodes 76A and 76B are, for example, formed of a metal such as aluminum (Al), gold (Au), or tin (Sn). It is preferable that the connection point between the metal layer El and the contact electrode 76A and the connection point between the metal layer E2 and the contact electrode 76B be located in a region outside the vibrating portion 120, and in this embodiment, these points are connected in the holding portion 140.

Furthermore, a through hole that contains a first metal layer 80 is formed in the silicon oxide film L31 formed on the surface of the Si substrate L3 of the top cover 30 that faces the MEMS substrate 50.

The bonding part 60 is formed in a rectangular annular shape along the XY plane around the periphery of the vibrating portion 120 of the resonator 10 between the MEMS substrate 50 (resonator 10 and bottom cover 20) and the top cover 30 on the holding portion 140, for example. The bonding part 60 bonds the MEMS substrate 50 and the top cover 30 to each other so as to seal the vibration space of the resonator 10. This enables the vibration space to be hermetically sealed and a vacuum state to be maintained.

In this embodiment, the bonding part 60 includes a second metal layer 61 formed on the MEMS substrate 50 and a third metal layer 62 formed on the top cover 30, and the MEMS substrate 50 and the top cover 30 are bonded to each other by the second metal layer 61 and the third metal layer 62 eutectically bonding with each other.

Figure 5:
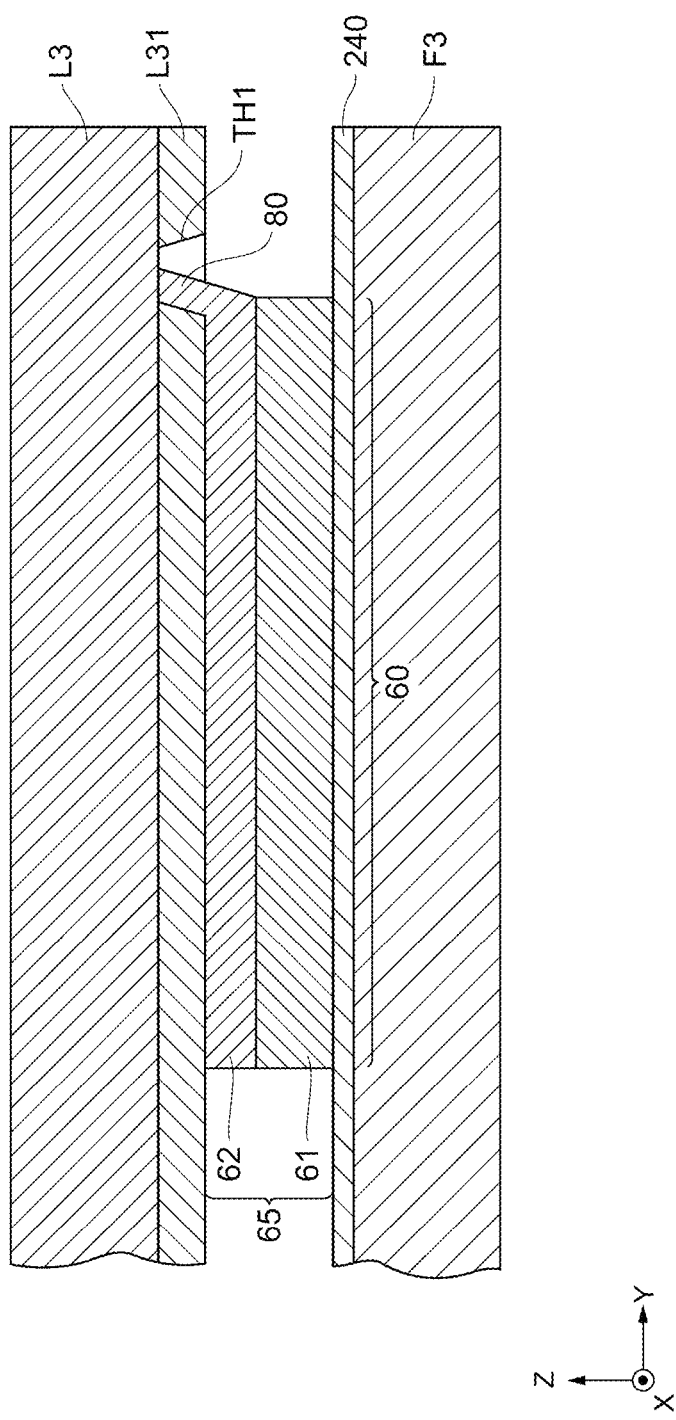
FIG. 5 is a main part enlarged sectional view schematically illustrating the configuration of the region around a bonding part illustrated in FIG. 4.

Next, the multilayer structure in the region around the bonding part 60 according to the embodiment of the present invention will be described while referring to FIG. 5. FIG. 5 is a main part enlarged sectional view schematically illustrating the configuration of the region around the bonding part 60 illustrated in FIG. 4.

As illustrated in FIG. 5, the bonding part 60 includes a eutectic layer 65 having a eutectic alloy as a main component. The eutectic alloy of the eutectic layer 65 is, for example, a eutectic alloy of the second metal layer 61 having aluminum (Al) as a main component and the third metal layer 62 consisting of germanium (Ge).

In the example illustrated in FIG. 5, the second metal layer 61 and the third metal layer 62 are illustrated as separate layers, but in reality, there is eutectic bonding at the interface between these layers. In other words, the eutectic layer 65 mainly consists of a eutectic alloy of a second metal having aluminum (Al) as a main component and a third metal that is germanium (Ge). Thus, as a result of the second metal of the second metal layer 61 being a metal having aluminum (Al) as a main component and the third metal of the third metal layer 62 being germanium (Ge), the bonding part 60 where the top cover 30 and the MEMS substrate 50 are eutectically bonded to each other can be easily realized. In addition, since the second metal layer 61 having aluminum (Al) as a main component is formed on the MEMS substrate 50, conductivity testing of the resonator 10 can be performed using the second metal layer 61, for example, during the process of manufacturing the resonance device 1.

In the following description, unless specifically stated, the second metal of the second metal layer 61 is aluminum (Al), the third metal of the third metal layer 62 is germanium (Ge), and the eutectic layer 65 has aluminum-germanium as a main component. In this case, the eutectic layer 65 may include aluminum (Al) and germanium (Ge) in addition to aluminum-germanium.

The second metal of the second metal layer 61 is preferably aluminum (Al), an aluminum-copper alloy (AlCu alloy), or an aluminum-silicon-copper alloy (AlSiCu alloy). Since aluminum or an aluminum alloy is a metal that is often used for wiring, for example, in resonance devices and so forth, using aluminum (Al), an aluminum-copper alloy (AlCu alloy), or an aluminum-silicon-copper alloy (AlSiCu alloy) as the second metal of the second metal layer 61 enables easy eutectic bonding with the germanium (Ge) of the third metal layer 62. In addition, it is possible to easily eutectically bond with germanium (Ge) of the third metal layer 62, simplify the process of manufacturing the resonance device 1 and to easily form the bonding part 60 that seals the vibration space of the resonator 10.

The silicon oxide film L31 includes a through hole TH1 that penetrates to the bottom surface of the Si substrate L3 (surface on negative Z axis direction side in FIG. 5). The first metal layer 80 is formed so as to cover part of the opening of the through hole TH1. The first metal layer 80 may instead be formed so as to entirely cover the opening of the through hole TH1.

Furthermore, in the example illustrated in FIG. 5, the first metal layer 80 is formed so as to be integrated with the third metal layer 62 of the bonding part 60. In other words, the material of the first metal layer 80 is the same as the material of the third metal layer 62 and is germanium (Ge), for example. This enables the first metal layer 80 to be formed in the same step as the third metal layer 62 and enables the process of manufacturing the resonance device 1 to be simplified.

Figure 6:
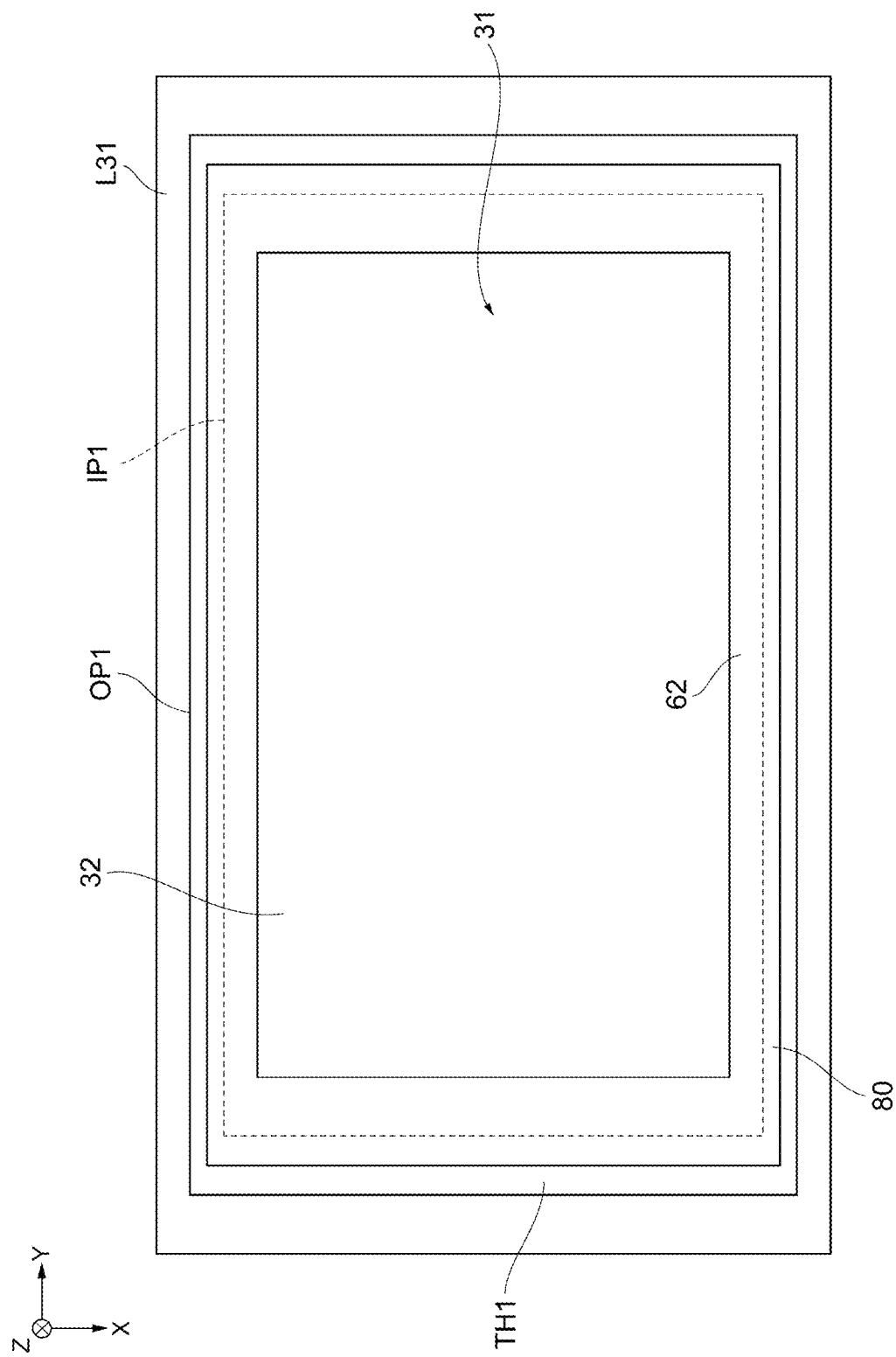
FIG. 6 is a plan view schematically illustrating the configuration when a rear surface of a top cover illustrated in FIGS. 1 to 4 is viewed in plan view.

Next, the through hole TH1 and the first metal layer 80 according to the embodiment of the present invention will be described while referring to FIG. 6. FIG. 6 is a plan view schematically illustrating the configuration when a rear surface of the top cover 30 illustrated in FIGS. 1 to 4 is viewed in plan view.

As illustrated in FIG. 6, when the rear surface of the top cover 30 is viewed in plan view, the through hole TH1 has an annular shape so as to surround the periphery of a bottom surface 32 of the recess 31 forming the vibration space. The third metal layer 62 is also formed so as to surround the periphery of the bottom surface 32 of the recess 31 and extends beyond an inner periphery IP1 of the through hole TH1 up to a point between the inner periphery IP1 and an outer periphery OP1 of the through hole TH1. The silicon oxide film L31 is formed outside the through hole TH1.

In this manner, the silicon oxide film L31 formed on the surface of the top cover 30 that faces the MEMS substrate 50 includes the through hole TH1 that is formed along at least part of the periphery of the vibration space of the resonator 10 when the rear surface of the top cover 30 is viewed in plan view and that penetrates to the bottom surface of the Si substrate L3, and as a result of the through hole TH1 including the first metal layer 80, a gas such as helium (He) having a small atomic radius that is able to penetrate through the silicon oxide film L31 and enter the vibration space can be blocked by the first metal layer 80. Therefore, it is possible suppress a reduction in the degree of vacuum of the vibration space caused by entry of gas.

In addition, the first metal layer 80 formed in the through hole TH1 is able to further suppress entry of a gas such as helium (He) due to the through hole TH1 having an annular shape when the rear surface of the top cover 30 is viewed in plan view, as illustrated in FIG. 6.

In this embodiment, in FIG. 5, an example is illustrated in which the through hole TH1 is disposed on the positive Y axis direction side of (outside) the bonding part 60, but the present invention is not limited to this configuration. For example, the through hole TH1 may instead be disposed on the negative Y axis direction side of (inside from) the bonding part 60. In addition, in FIG. 6, an example is illustrated in which the through hole TH1 is formed in an annular shape along the periphery of the vibration space of the resonator 10, but the through hole TH1 is not limited to this configuration. It is sufficient that the through hole TH1 be formed along at least part of the periphery of the vibration space of the resonator 10 and, for example, the through hole TH1 may be shaped so as to include discrete cut out parts rather than being shaped like a continuous groove.

Figure 7:
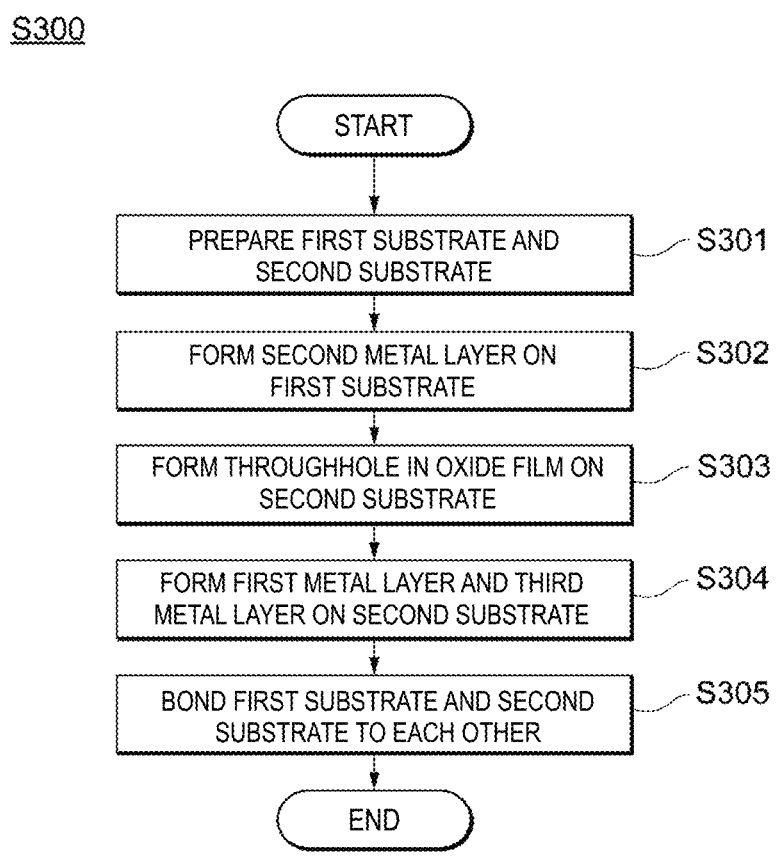
FIG. 7 is a flowchart illustrating a method of manufacturing a resonance device according to an embodiment of the present invention.
Figure 8:
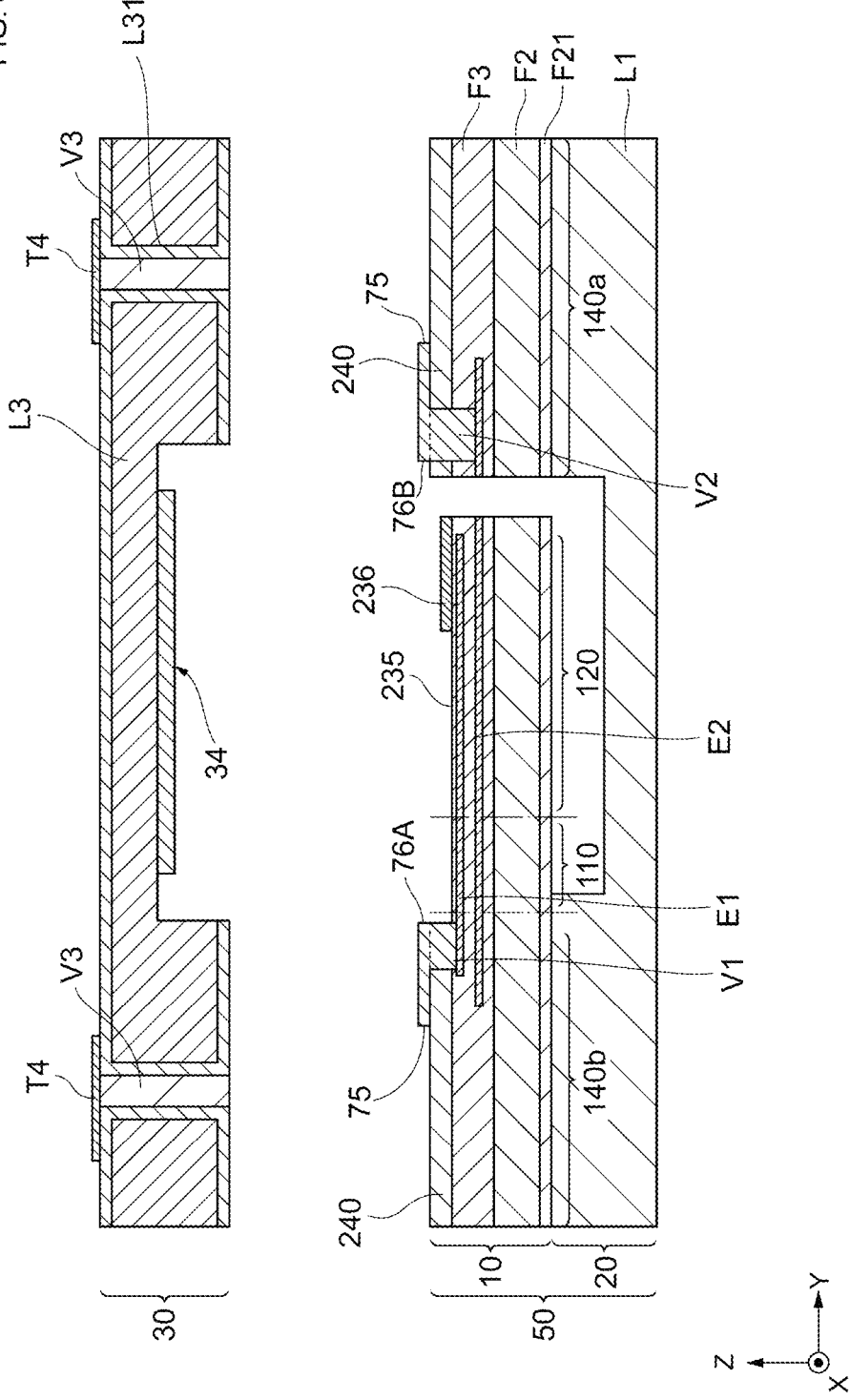
FIG. 8 is a sectional view for describing a step illustrated in FIG. 7.
Figure 9:
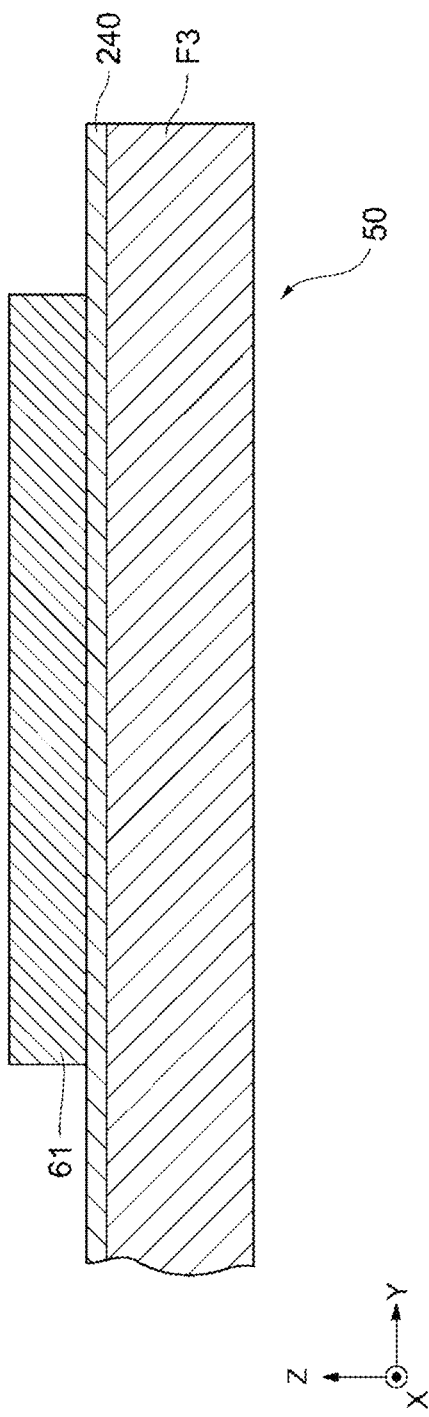
FIG. 9 is a sectional view for describing a step illustrated in FIG. 7.
Figure 10:
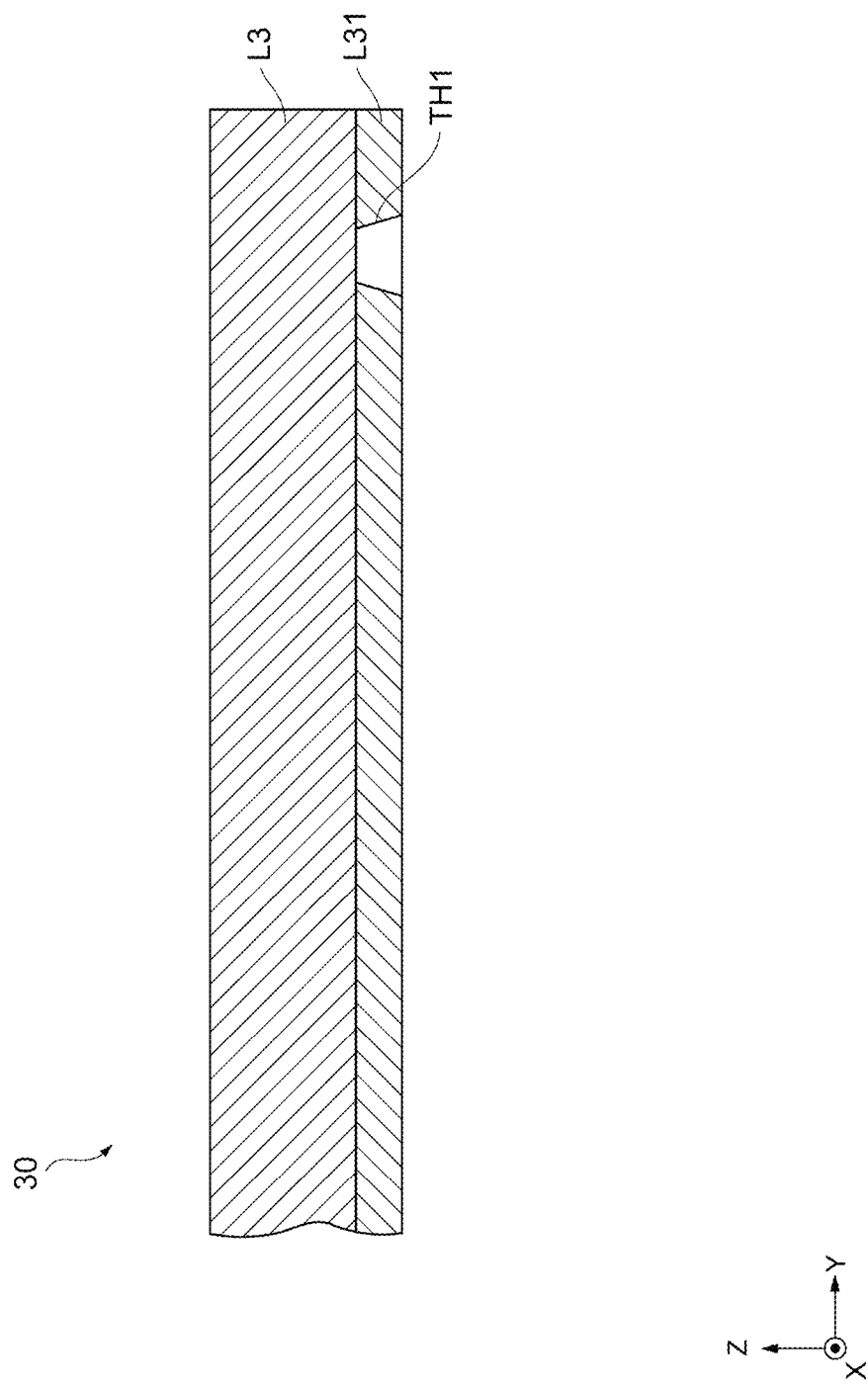
FIG. 10 is a sectional view for describing a step illustrated in FIG. 7.
Figure 11:
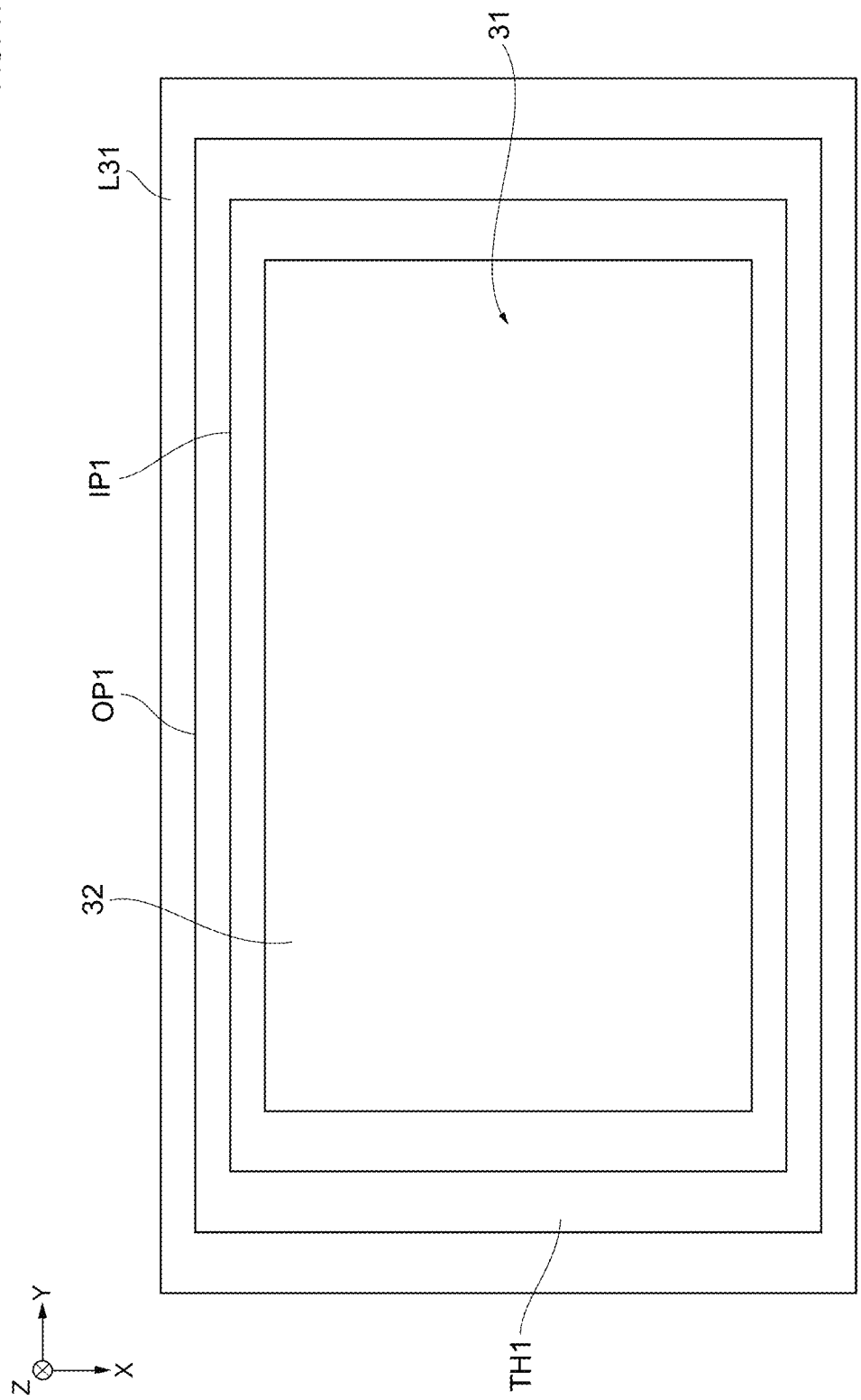
FIG. 11 is a sectional view for describing a step illustrated in FIG. 7.
Figure 12:
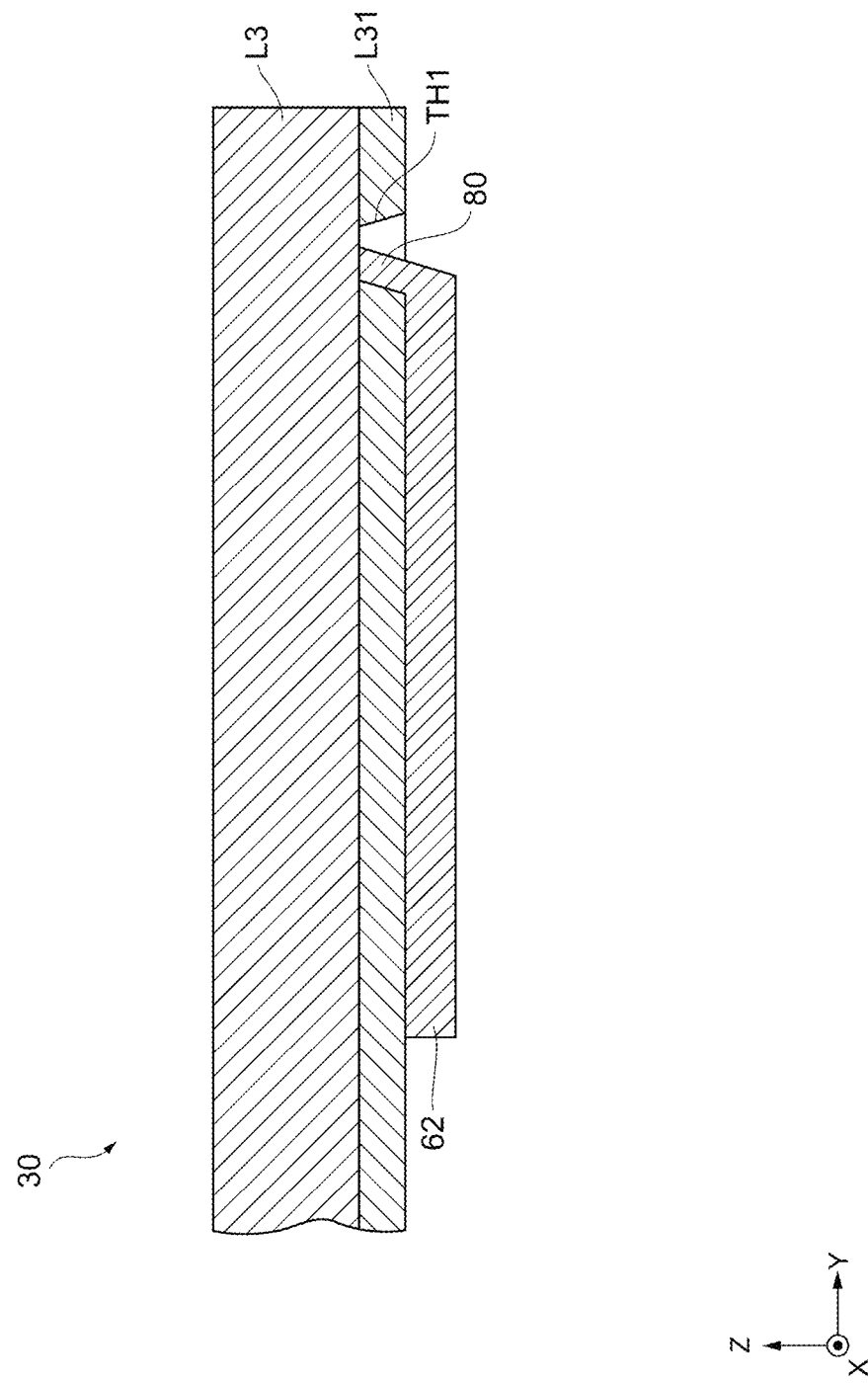
FIG. 12 is a sectional view for describing a step illustrated in FIG. 7.
Figure 13:
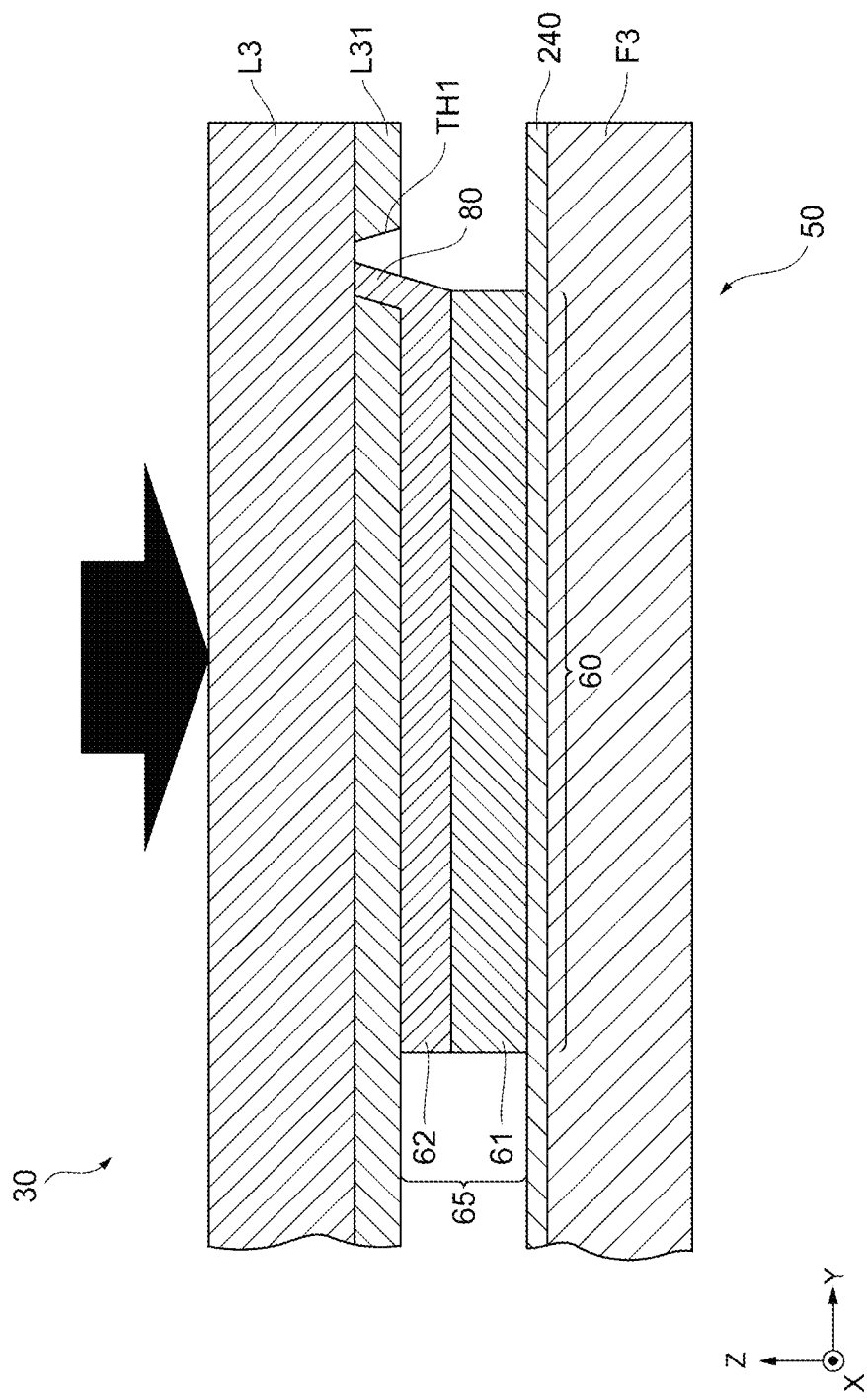
FIG. 13 is a sectional view for describing a step illustrated in FIG. 7.

Next, a method of manufacturing a resonance device according to an embodiment of the present invention will be described while referring to FIGS. 7 to 13. FIG. 7 is a flowchart illustrating a method of manufacturing the resonance device 1 according to an embodiment of the present invention. FIG. 8 is a sectional view for describing step S301 illustrated in FIG. 7. FIG. 9 is a sectional view for describing step S302 illustrated in FIG. 7. FIG. 10 is a sectional view for describing step S303 illustrated in FIG. 7. FIG. 11 is a sectional view for describing step S303 illustrated in FIG. 7. FIG. 12 is a sectional view for describing step S304 illustrated in FIG. 7. FIG. 13 is a sectional view for describing step S304 illustrated in FIG. 7. For the sake of convenience, one resonance device 1 of a plurality of resonance devices 1 manufactured using the manufacturing method is illustrated in FIGS. 8 to 13 and will be described.

As illustrated in FIG. 7, first, the MEMS substrate 50 and the top cover 30 are prepared (S301). Specifically, as illustrated in FIG. 8, the above-described MEMS substrate 50 including the resonator 10 and the above-described top cover 30 including the silicon oxide film L31 on the surface thereof that faces the resonator 10 are prepared. However, the connection wiring line 70, which is illustrated in FIG. 4 and is for connecting the through electrode V3 and the resonator 10 to each other, is not formed yet. In addition, the bonding part 60 and the first metal layer 80 are also not formed yet.

Note that although an example is illustrated in which the MEMS substrate 50 and the top cover 30 are prepared in step S301, the present invention is not limited to this example. For example, a step of preparing the MEMS substrate 50 and a step of preparing the top cover 30 may be performed separately.

Returning to FIG. 7, next, the second metal layer 61 is formed along the periphery of the vibrating portion 120 of the resonator 10 (S302) in the MEMS substrate 50 prepared in step S301.

Specifically, as illustrated in FIG. 9, for example, aluminum (Al) is stacked on the parasitic capacitance reducing film 240 formed on the piezoelectric thin film F3 in the prepared MEMS substrate 50 (resonator 10). Next, the second metal layer 61 is formed outside the vibrating portion 120 in the MEMS substrate 50 by shaping the stacked aluminum (Al) into a desired shape by performing etching or the like. The second metal layer 61 is formed along the periphery of a vibration space of the resonator 10 when the MEMS substrate 50 is viewed in plan view.

After forming the second metal layer 61, the MEMS substrate 50 may be subjected to a degassing heat treatment at a high temperature of around 435° C., for example. The second metal layer 61 is negligibly affected by thermal diffusion even when the heat treatment is performed at a high temperature.

Step S302 may be performed as part of the step of preparing of the MEMS substrate 50, for example.

Returning to FIG. 7, next, the through hole TH1 is formed in the silicon oxide film L31 (S303) of the top cover 30 prepared in step S301.

Specifically, as illustrated in FIG. 10, the through hole TH1 that penetrates to the rear surface of the top cover 30 is formed by removing the silicon oxide film L31 by performing etching or the like at a prescribed position on the silicon oxide film L31. Furthermore, as illustrated in FIG. 11, the through hole TH1 is formed along the periphery of the recess 31 forming the vibration space of the resonator 10 in the silicon oxide film L31. The inner periphery IP1 and the outer periphery OP1 of the through hole TH1 are disposed outside the bottom surface 32.

Returning to FIG. 7, next, the first metal layer 80 and the third metal layer 62 are formed on the top cover 30 (S304) in which the through hole TH1 was formed in step S303.

Specifically, as illustrated in FIG. 12, the third metal layer 62 is formed at a prescribed position by stacking germanium (Ge) on the surface of the silicon oxide film L31 on the rear surface of the top cover 30. The prescribed position at which the third metal layer 62 is formed is, for example, a position, on the rear surface of the top cover 30, that faces or substantially faces the second metal layer 61 formed in the MEMS substrate 50 when the front surface of the MEMS substrate 50 and the rear surface of the top cover 30 are made to face each other. Furthermore, the first metal layer 80 is formed so as to cover part of the opening of the through hole TH1 by providing the third metal layer 62 so as to extend up to the through hole TH1 in the positive Y axis direction. Thus, the first metal layer 80 and the third metal layer 62 are formed using the same process.

After forming the first metal layer 80 and the third metal layer 62, the top cover 30 is subjected to a degassing heat treatment at a high temperature of around 435° C., for example. In this way, gas contained in the top cover 30, the first metal layer 80, and the third metal layer 62 can be sufficiently released (evaporated) and the occurrence of outgassing can be thereby reduced.

Step S303 and step S304 may be, for example, be performed as part of the step of preparing the top cover 30.

Returning to FIG. 7, next, the MEMS substrate 50 in which the second metal layer 61 was formed in step S302 and the top cover 30 in which the first metal layer 80 and the third metal layer 62 were formed in step S304 are bonded to each other so that the vibration space of the resonator 10 is sealed (S305). The step S305 includes forming the bonding part 60 that includes the eutectic layer 65 that is mainly composed of a eutectic alloy of the second metal that has aluminum (Al) as a main component and a third metal that is germanium (Ge).

Specifically, the positions of the MEMS substrate 50 and the top cover 30 are aligned so that the second metal layer 61 and the third metal layer 62 are aligned with each other. After being aligned, the MEMS substrate 50 and the top cover 30 are sandwiched between heaters or the like and subjected to a heat treatment in order to induce a eutectic reaction. At this time, the top cover 30 is moved toward the MEMS substrate 50. As a result, as illustrated in FIG. 13, the third metal layer 62 contacts the second metal layer 61.

The temperature used in the heat treatment for eutectic bonding is preferably greater than or equal to the temperature of the eutectic point and less than the melting point in the case of aluminum (Al) by itself, i.e., around 424° C. to 620° C. Furthermore, the heating time is preferably around 10 to 20 minutes. In this embodiment, a heat treatment is performed at a temperature of 430° C. to 500° C. for around 15 minutes.

During heating, the top cover 30 and the MEMS substrate 50 are pressed in a direction from the top cover 30 toward the MEMS substrate 50 as indicated by the black arrow in FIG. 13. The pressure applied during the pressing is preferably from around 5 MPa to around 25 MPa.

Furthermore, after the heat treatment for inducing eutectic bonding, a cooling treatment is performed, for example, by natural cooling. The cooling process is not limited to natural cooling, it is sufficient that the eutectic layer 65 is able to be formed at the bonding part 60, and the cooling temperature and cooling speed can be selected in various ways.

As a result of performing step S305 illustrated in FIG. 7, the bonding part 60 including the eutectic layer 65, which has the eutectic alloy of the second metal and the third metal as a main component, is formed, as illustrated in FIG. 5.

In addition, the connection wiring line 70, which is illustrated in FIG. 4, for connecting the through electrode V3 and the resonator 10 to each other may be provided by forming an aluminum (Al) film on the MEMS substrate 50 when forming the second metal layer 61, forming a germanium (Ge) film on the top cover 30 when forming the third metal layer 62, and then eutectic bonding these layers together.

In this embodiment, an example depicted in FIG. 5 is illustrated as the bonding part 60 and through hole TH1, but the present invention is not limited to this configuration. For example, the bonding part 60 may include a layer other than the eutectic layer 65 and the through hole TH1 may include a metal other than the first metal layer 80.

FIRST MODIFICATION

Figure 14:
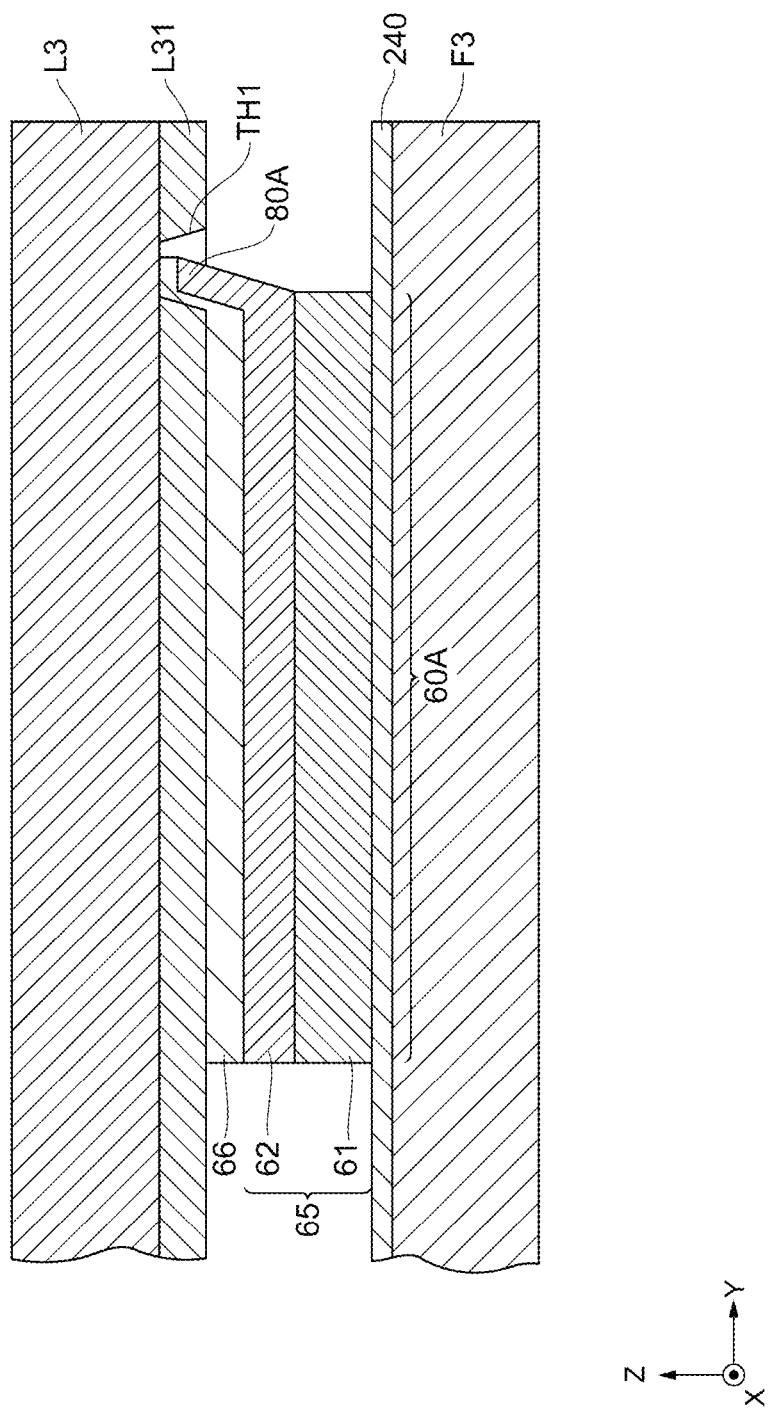
FIG. 14 is a main part enlarged sectional view schematically illustrating a First Modification of the region around a bonding part illustrated in FIG. 5.

FIG. 14 is a main part enlarged sectional view schematically illustrating a First Modification of the region around the bonding part 60 illustrated in FIG. 5. Note that, in the First Modification, constituent parts that are the same as those in the vicinity of the bonding part 60 illustrated in FIG. 5 are denoted by the same symbols and description thereof is omitted as appropriate. In addition, the same operational effects resulting from the same configurations are not repeatedly described.

As illustrated in FIG. 14, a bonding part 60A includes a titanium (Ti) layer 66 in addition to the eutectic layer 65. The titanium (Ti) layer 66 is continuously provided from the side near the top cover 30 to the third metal layer 62.

The material constituting the titanium (Ti) layer 66 is titanium (Ti). Since titanium (Ti) has high adhesiveness with silicon (Si) and silicon dioxide ($SiO_2$), the titanium (Ti) layer 66 functions as an adhesive layer for adhering the eutectic layer 65. Therefore, the adhesiveness between the bonding part 60A and the MEMS substrate 50 can be improved by the bonding part 60A including the titanium (Ti) layer 66 between the eutectic layer 65 and the top cover 30. Therefore, the bonding strength of the bonding part 60A and the air tightness of the resonance device 1 can be further improved.

Furthermore, a first metal layer 80A formed in the through hole TH1 includes the titanium of the titanium (Ti) layer 66 in addition to germanium (Ge), which is the same material as the third metal layer 62.

In a manufacturing method of the First Modification, in step S304 illustrated in FIG. 12, the titanium (Ti) layer 66 is formed on the top cover 30, in which the through hole TH1 is formed, in addition to the first metal layer 80 and the third metal layer 62.

Specifically, the titanium (Ti) layer 66 is provided at a prescribed position by stacking titanium (Ti) on the surface of the silicon oxide film L31 on the rear surface of the top cover 30. Next, the third metal layer 62 is formed by stacking germanium (Ge) on the titanium (Ti) layer 66. In addition, the first metal layer 80A is formed so as to cover part of the opening of the through hole TH1 by providing the titanium (Ti) layer 66 and the third metal layer 62 so as to extend up to the through hole TH1 in the positive Y axis direction. Thus, the first metal layer 80A, the third metal layer 62, and the titanium (Ti) layer 66 are formed in the same process.

SECOND MODIFICATION

Figure 15:
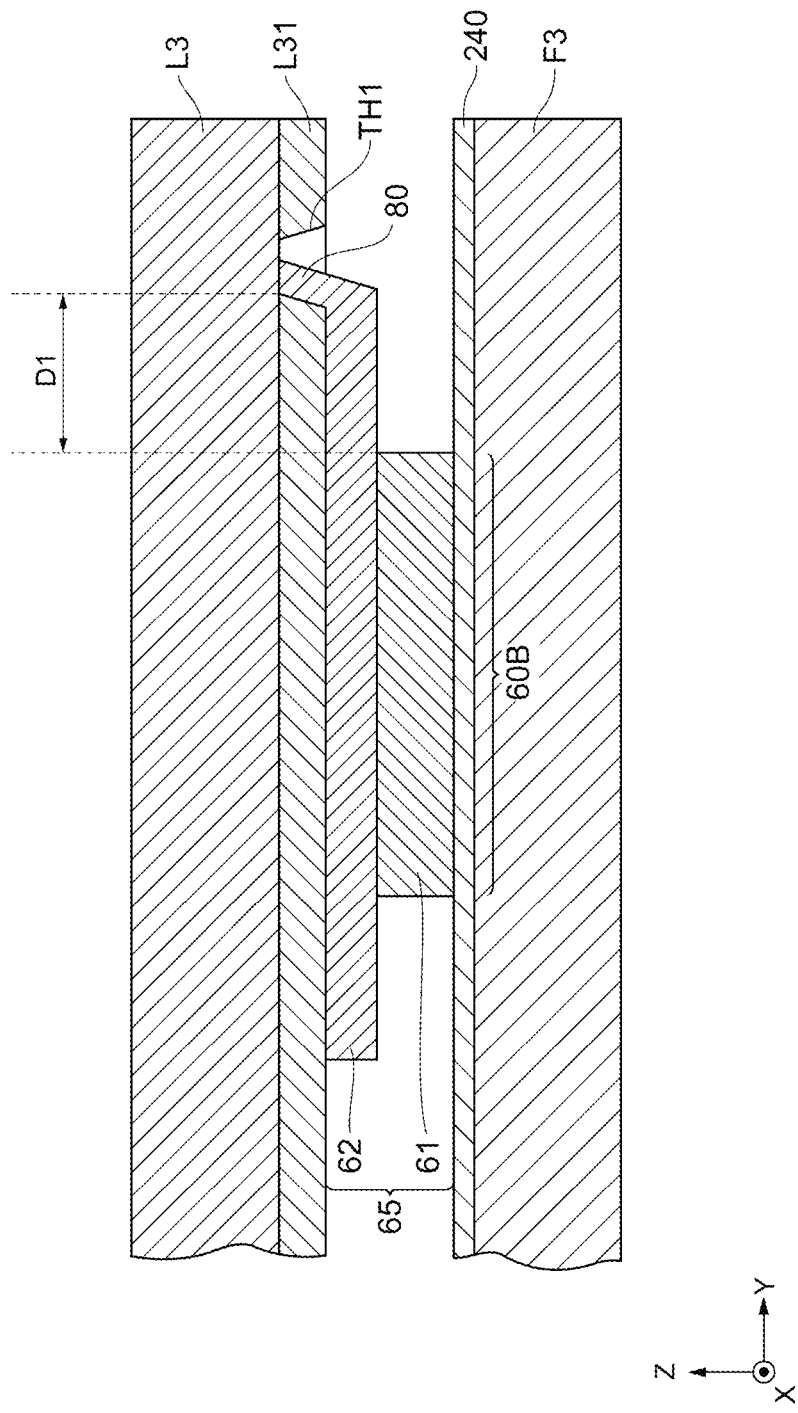
FIG. 15 is a main part enlarged sectional view schematically illustrating a Second Modification of the region around a bonding part illustrated in FIG. 5.

FIG. 15 is a main part enlarged sectional view schematically illustrating a Second Modification of the region around the bonding part 60 illustrated in FIG. 5. Note that, in the Second Modification, constituent parts that are the same as those in the vicinity of the bonding part 60 illustrated in FIG. 5 are denoted by the same symbols and description thereof is omitted as appropriate. In addition, the same operational effects resulting from the same configurations are not repeatedly described.

As illustrated in FIG. 15, an end portion (right end portion in FIG. 15) of a bonding part 60B is disposed at a distance D1 from a side surface of the through hole TH1 towards the vibration space. In more detail, in the bonding part 60 illustrated in FIG. 5, the end portion of the second metal layer 61 is at a distance of zero or substantially zero from the side wall of the through hole TH1, whereas in the bonding part 60B, the end portion of the second metal layer 61 is at the distance D1 from the side surface of the through hole TH1. The distance D1 is, for example, around 5 μm when the lengths (widths) of the third metal layer 62 and the first metal layer 80 along the Y axis are from 40 μm to 50 μm. At this time, the thickness of the second metal layer 61 is around 700 nm, the thickness of the third metal layer 62 is around 380 nm, and the thickness of the silicon oxide film L31 is around 1 μm.

By disposing the end portion (right end portion in FIG. 15) of the bonding part 60B at the distance D1 from the side surface of the through hole TH1 in this way, it is possible to better suppress diffusion of silicon (Si) of the Si substrate L3 into the eutectic layer 65 during eutectic bonding compared to the case where the end portion is disposed without the distance D1. Therefore, the bonding strength of the bonding part 60B and the air tightness of the resonance device 1 can be further improved.

THIRD MODIFICATION

Figure 16:
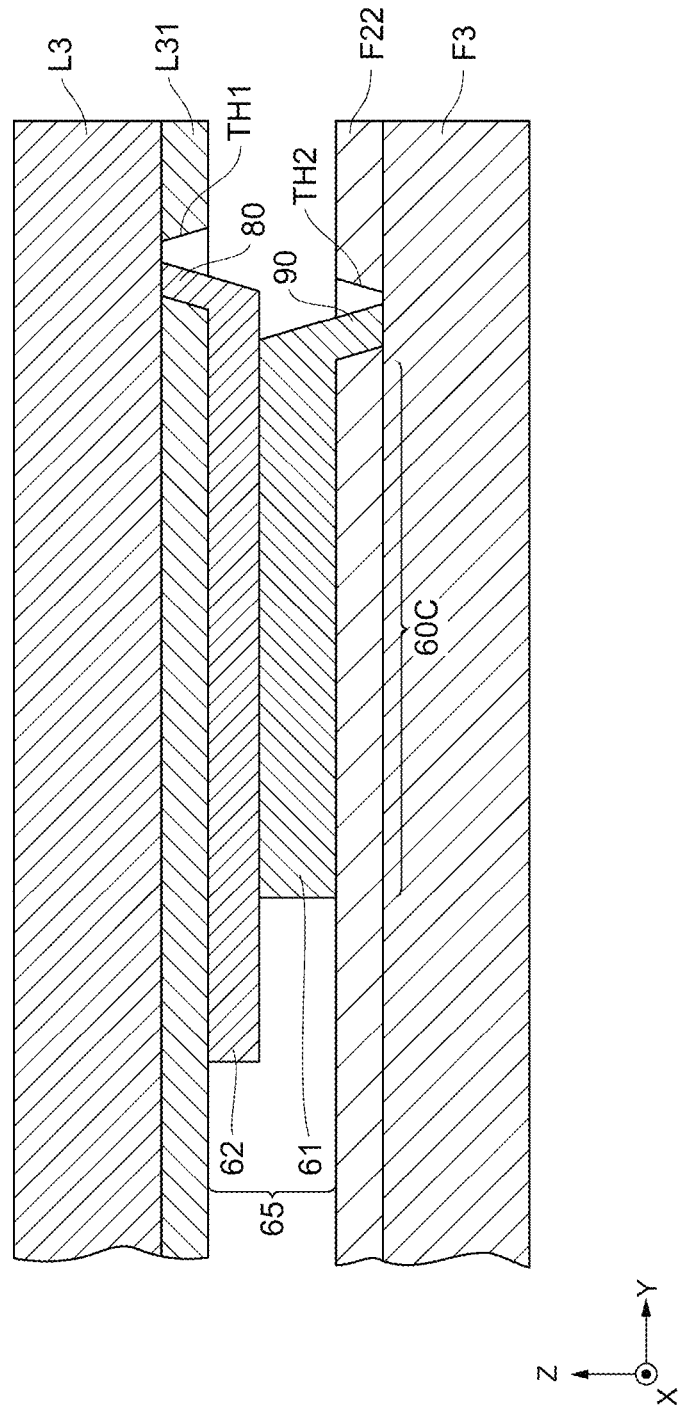
FIG. 16 is a main part enlarged sectional view schematically illustrating a Third Modification of the region around a bonding part illustrated in FIG. 5.

FIG. 16 is a main part enlarged sectional view schematically illustrating a Third Modification of the region around the bonding part 60 illustrated in FIG. 5. FIG. 17 is a plan view schematically illustrating the configuration when a surface of the MEMS substrate 50 in the Third Modification is viewed in plan view. Note that, in the Third Modification, constituent parts that are the same as those in the vicinity of the bonding part 60 illustrated in FIG. 5 are denoted by the same symbols and description thereof is omitted as appropriate. In addition, the same operational effects resulting from the same configurations are not repeatedly described.

As illustrated in FIG. 16, similarly to the bonding part 60 illustrated in FIG. 5, a bonding part 60C includes the eutectic layer 65 that has, as a main component, the eutectic alloy of the second metal of the second metal layer 61 and the third metal of the third metal layer 62. However, instead of the parasitic capacitance reducing film 240, a silicon oxide film F22 is formed on the piezoelectric thin film F3 of the resonator 10. In other words, the piezoelectric thin film F3, which is stacked on the top surface of the Si substrate F2, which is not illustrated, and the silicon oxide film F22 are formed. The silicon oxide film F22 is composed of silicon dioxide ($SiO_2$), for example. Parasitic capacitances that may be generated between the metal layers E1 and E2 included in the piezoelectric thin film F3 and the Si substrate F2 can be reduced by having the MEMS substrate 50 include the silicon oxide film F22, which has a small relative dielectric constant, on the piezoelectric thin film F3.

The silicon oxide film F22 includes a through hole TH2 that penetrates to the piezoelectric thin film F3. A fourth metal layer 90 is formed so as to cover part of the opening of the through hole TH2. The fourth metal layer 90 may instead be formed so as to entirely cover the opening of the through hole TH2.

Furthermore, in the example illustrated in FIG. 16, the fourth metal layer 90 is formed so as to be integrated with the second metal layer 61 of the bonding part 60C. In other words, the material of the fourth metal layer 90 is the same as the material of the second metal layer 61 and is a metal having aluminum (Al) as a main component, for example. This enables the fourth metal layer 90 to be formed in the same step as the second metal layer 61 and enables the process of manufacturing the resonance device 1 to be simplified.

As illustrated in FIG. 17, when the front surface of the MEMS substrate 50 is viewed in plan view, for example, the through hole TH2 has an annular shape so as to surround the vibrating portion 120 of the resonator 10 on the holding portion 140. The second metal layer 61 is also formed along the periphery of the vibrating portion 120 on the holding portion 140 and extends beyond an inner periphery IP2 of the through hole TH2 up to a point between the inner periphery IP2 and an outer periphery OP2 of the through hole TH2. The silicon oxide film F22 is formed outside the through hole TH2.

Thus, in the MEMS substrate 50, the silicon oxide film F22 stacked on the surface facing the top cover 30 includes the through hole TH2 that is formed along at least part of the periphery of the vibration space of the resonator 10 and that penetrates to the piezoelectric thin film F3, and the through hole TH2 includes the fourth metal layer 90. As a result of the through hole TH2 including the fourth metal layer 90, a gas such as helium (He) having a small atomic radius that can penetrate through the silicon oxide film F22 and enter the vibration space can be blocked by the fourth metal layer 90. Therefore, a reduction in the degree of vacuum of the vibration space caused entry of gas can be suppressed while reducing parasitic capacitances.

Furthermore, as illustrated in FIG. 17, the fourth metal layer 90 in the through hole TH2 is able to further suppress entry of a gas such as helium (He) as a result of the through hole TH2 having an annular shape when the front surface of the MEMS substrate 50 is viewed in plan view.

In a manufacturing method of the Third Modification, in step S302 illustrated in FIG. 9, first, the through hole TH2 is formed in the silicon oxide film F22 of the prepared MEMS substrate 50. Then, the second metal layer 61 and the fourth metal layer 90 are formed on the MEMS substrate 50 in which the through hole TH2 has been formed.

Specifically, the through hole TH2 that penetrates to the piezoelectric thin film F3 is formed by removing the silicon oxide film F22 by performing etching or the like at a prescribed position on the silicon oxide film F22. Furthermore, as illustrated in FIG. 17, the through hole TH2 is formed in the silicon oxide film F22 on the holding portion 140, that is, along the periphery of the vibrating portion 120 of the resonator 10. The inner periphery IP2 and the outer periphery OP2 of the through hole TH2 are disposed outside the vibrating portion 120.

Next, the second metal layer 61 is formed by stacking, for example, aluminum (Al) on the surface of the silicon oxide film F22 on the MEMS substrate 50 (resonator 10) and forming the stacked aluminum (Al) into a desired shape by performing etching or the like. The second metal layer 61 is formed along the periphery of a vibration space of the resonator 10 when the MEMS substrate 50 is viewed in plan view. Furthermore, as illustrated in FIG. 16, the fourth metal layer 90 is formed so as to cover part of the opening of the through hole TH2 by providing the second metal layer 61 so as to extend up to the through hole TH2 in the positive Y axis direction. Thus, the fourth metal layer 90 and the second metal layer 61 are formed using the same process.

Exemplary embodiments of the present invention have been described above. In a resonance device according to an embodiment of the present invention, a silicon oxide film formed on a surface of a top cover that faces a MEMS substrate includes a through hole that is formed along at least part of a periphery of a vibration space of a resonator when a rear surface of the top cover is viewed in plan view and that penetrates to a bottom surface of a Si substrate, and the through hole includes a first metal layer. This enables gas such as helium (He) having a small atomic radius that can penetrate through the silicon oxide film and enter the vibration space to be blocked by the first metal layer. Therefore, it is possible suppress a reduction in the degree of vacuum of the vibration space caused by entry of gas.

Furthermore, in the above-described resonance device, the material of the first metal layer is the same as the material of a third metal layer. This enables the first metal layer to be formed in the same step as the third metal layer and enables the process of manufacturing the resonance device to be simplified.

In addition, in the above-described resonance device, a second metal of the second metal layer is a metal having aluminum (Al) as a main component and a third metal of the third metal layer is germanium (Ge). This enables a bonding part where the top cover and the MEMS substrate are eutectic bonded to be easily realized. In addition, since the second metal layer having aluminum (Al) as a main component is formed on the MEMS substrate, conductivity testing of the resonator can be performed using the second metal layer, for example, in the process of manufacturing the resonance device.

In addition, in the above-described resonance device, the second metal of the second metal layer is germanium (Ge) and the third metal of the third metal layer is a metal having aluminum (Al) as a main component. In this case as well, similarly, a bonding part where the top cover and the MEMS substrate are eutectically bonded can be easily realized.

In addition, in the above-described resonance device, the second metal of the second metal layer is aluminum (Al), an aluminum-copper alloy (AlCu alloy), or an aluminum-silicon-copper alloy (AlSiCu alloy). This enables easy eutectic bonding with the germanium (Ge) of the third metal layer, and makes it possible to simplify the process of manufacturing the resonance device and to easily form the bonding part that seals the vibration space of the resonator.

Furthermore, in the above-described resonance device, the MEMS substrate includes a silicon oxide film having a small relative dielectric constant on a piezoelectric thin film. This enables a parasitic capacitance that may be generated between a metal layer included in the piezoelectric thin film and the Si substrate to be reduced. Furthermore, in the MEMS substrate, a silicon oxide film stacked on the surface that faces the top cover includes a through hole that is formed along at least part of the periphery of the vibration space of the resonator and that penetrates to the piezoelectric thin film, and the through hole includes a fourth metal layer. This enables gas such as helium (He) having a small atomic radius that can penetrate through the silicon oxide film and enter the vibration space to be blocked by the fourth metal layer. Therefore, a reduction in the degree of vacuum of the vibration space caused entry of gas can be suppressed while reducing parasitic capacitances.

Furthermore, in the above-described resonance device, the material of the fourth metal layer is the same as the material of the second metal layer. This enables the fourth metal layer to be formed in the same step as the second metal layer 61 and enables the process of manufacturing the resonance device to be simplified.

Furthermore, in the above-described resonance device, the through hole has an annular shape when the surface of the MEMS substrate is viewed in plan view. Thus, entry of gas such as helium (He) can be further suppressed by the fourth metal layer in the through hole.

Furthermore, in the above-described resonance device, the material of the top cover is silicon (Si) and the material of the silicon oxide film is silicon dioxide (SiO$_2$). This enables a resonance device in which a reduction in the degree of vacuum of the vibration space is suppressed to be easily realized.

In addition, in the above-described resonance device, the bonding part includes the titanium (Ti) layer 66 between the eutectic layer and the top cover. This allows the adhesiveness between the bonding part and the MEMS substrate to be improved. Therefore, the bonding strength of the bonding part and the air tightness of the resonance device can be further improved.

In addition, in the above-described resonance device, the through hole has an annular shape when the rear surface of the top cover is viewed in plan view. Thus, entry of gas such as helium (He) can be further suppressed by the first metal layer formed in the through hole.

Furthermore, in the above-described resonance device, an end portion of the bonding part is disposed at a distance from a side surface of the through hole. This enables diffusion of silicon (Si) of the Si substrate into the eutectic layer during eutectic bonding to be better suppressed compared with a case where the end portion is disposed without the distance. Therefore, the bonding strength of the bonding part and the air tightness of the resonance device 1 can be further improved.

In a resonance device manufacturing method according to an embodiment of the present invention, a step of preparing the top cover includes forming a through hole, which penetrates to a bottom surface of the Si substrate, in the silicon oxide film along at least part of a periphery of a vibration space of the resonator and forming the first metal layer in the through hole. This enables gas such as helium (He) having a small atomic radius that can penetrate through the silicon oxide film and enter the vibration space to be blocked by the first metal layer. Therefore, it is possible suppress a reduction in the degree of vacuum of the vibration space caused by entry of gas.

The purpose of the embodiments described above is to enable easy understanding of the present invention and the embodiments are not to be interpreted as limiting the present invention. The present invention can be modified or improved without departing from the gist of the invention and equivalents to the present invention are also included in the present invention. In other words, appropriate design changes made to the embodiments by those skilled in the art are included in the scope of the present invention so long as the changes have the characteristics of the present invention. For example, the elements included in the embodiments and the arrangements, materials, conditions, shapes, sizes and so forth of the elements are not limited to those exemplified in the embodiments and can be changed as appropriate. In addition, each embodiment is merely an illustrative example and it goes without saying that parts of the configurations illustrated in different embodiments can be substituted for each other or combined with each other and these new configurations are also included in the scope of the present invention so long as the configurations have the characteristics of the present invention.

REFERENCE SIGNS LIST

1 . . . resonance device,
10 . . . resonator,
20 . . . bottom cover,
21 . . . recess
22 . . . bottom plate,
23 . . . side wall,
30 . . . top cover,
31 . . . recess,
32 . . . bottom surface,
33 . . . side wall,
34 . . . getter layer,
50 . . . MEMS substrate,
60, 60A, 60B, 60C . . . bonding part,
61 . . . second metal layer,
62 . . . third metal layer,
65 . . . eutectic layer,
66 . . . titanium (Ti) layer,
70 . . . connection wiring line,
76A, 76B . . . contact electrode,
80, 80A . . . first metal layer,
90 . . . fourth metal layer,
110 . . . holding arm,
120 . . . vibrating portion,
130 base portion,
131a . . . long side,
131A . . . front end,
131b long side,
131B . . . rear end,
131c . . . short side,
131d . . . short side,
135, 135A, 135B, 135C, 135D . . . vibrating arm,
140 . . . holding portion,
141 . . . voltage application part,
235 . . . protective film,
236 . . . frequency-adjusting film, 240 . . . parasitic capacitance reducing film,
D1 . . . distance,
E1, E2 . . . metal layer,
F2 . . . Si substrate,
F3 . . . piezoelectric thin film,
F21 . . . silicon oxide layer,
F22 . . . silicon oxide film,
G . . . weight portion,
IP1, IP2 . . . inner periphery,
L1 . . . Si wafer,
L3 . . . Si substrate,
L22 . . . silicon oxide film,
L31 . . . silicon oxide film,
OP1, OP2 outer periphery,
P . . . virtual plane,
T4 . . . terminal,
TH1 . . . through hole,
TH2 . . . through hole,
V1, V2 . . . via,
V3 . . . through electrode.

The invention claimed is:

1. A resonance device comprising:
a first substrate that includes a resonator;
a second substrate that includes a first oxide film on a surface thereof that faces the first substrate; and
a bonding part that bonds the first substrate and the second substrate to each other so as to seal a vibration space of the resonator,
wherein the first oxide film includes a first through hole along at least part of a periphery of the vibration space when the second substrate is viewed in a plan view of the resonance device, the first through hole penetrating to the surface of the second substrate,
the first through hole includes a first metal therein, and
the first through hole has an annular shape when the second substrate is viewed in the plan view.

2. The resonance device according to claim 1,
wherein the bonding part includes a eutectic layer that has, as a main component thereof, a eutectic alloy of a second metal on the first substrate and a third metal on the second substrate, and va material of the first metal is the same as a material of the third metal.

3. The resonance device according to claim 2,
wherein the second metal is a metal having aluminum as a main component thereof, and
the third metal is germanium.

4. The resonance device according to claim 3, wherein the second metal is selected from aluminum, an aluminum-copper alloy, or an aluminum-silicon-copper alloy.

5. The resonance device according to claim 2,
wherein the second metal is germanium, and
the third metal is a metal having aluminum as a main component thereof.

6. The resonance device according to claim 5, wherein the third metal is selected from aluminum, an aluminum-copper alloy, or an aluminum-silicon-copper alloy.

7. The resonance device according to claim 2, wherein a material of the second substrate is silicon and a material of the first oxide film is silicon dioxide.

8. The resonance device according to claim 7, wherein the bonding part further includes a titanium layer between the eutectic layer and the second substrate.

9. The resonance device according to claim 1, wherein an end portion of the bonding part is disposed at a distance from a side surface of the first through hole towards the vibration space.

10. A resonance device comprising:
a first substrate that includes a resonator;
a second substrate that includes a first oxide film on a surface thereof that faces the first substrate; and
a bonding part that bonds the first substrate and the second substrate to each other so as to seal a vibration space of the resonator,
wherein the first oxide film includes a first through hole along at least part of a periphery of the vibration space when the second substrate is viewed in a plan view of the resonance device, the first through hole penetrating to the surface of the second substrate,
the first through hole includes a first metal therein,
wherein the bonding part includes a eutectic layer that has, as a main component thereof, a eutectic alloy of a second metal on the first substrate and a third metal on the second substrate,
a material of the first metal is the same as a material of the third metal,
wherein the first substrate includes a piezoelectric film and a second oxide film stacked on a surface thereof that faces the second substrate,
the second oxide film includes a second through hole along at least part of the periphery of the vibration space when the first substrate is viewed in the plan view and that penetrates the second oxide film to the piezoelectric film, and
the second through hole includes a fourth metal therein.

11. The resonance device according to claim 10, wherein a material of the fourth metal is the same as a material of the second metal.

12. The resonance device according to claim 10, wherein the second through hole has an annular shape when the first substrate is viewed in the plan view.

13. The resonance device according to claim 12, wherein the first through hole has an annular shape when the second substrate is viewed in the plan view.

14. A resonance device manufacturing method comprising:
preparing a first substrate that includes a resonator;
preparing a second substrate that includes a first oxide film on a surface thereof;
forming, in the first oxide film, a first through hole that penetrates to the surface of the second substrate along at least part of a periphery of a vibration space of the resonator when the second substrate is viewed in a plan view thereof;
forming a first metal in the first through hole; and
bonding the first substrate and the second substrate to each other such that the first oxide film faces the first substrate and so as to seal the vibration space of the resonator,
wherein the first through hole has an annular shape when the second substrate is viewed in the plan view.

15. The resonance device manufacturing method according to claim 14, further comprising:
forming a bonding part between the first substrate and the second substrate by forming a second metal on the first substrate and forming a third metal on the second substrate, wherein
the bonding part includes a eutectic layer that has, as a main component thereof, a eutectic alloy of the second metal formed on the first substrate and the third metal formed on the second substrate, and
a material of the first metal is the same as a material of the third metal.

16. The resonance device manufacturing method according to claim 15,
wherein the first substrate includes a piezoelectric film and a second oxide film stacked on a surface thereof that faces the second substrate, and the method further comprises:
forming, in the second oxide film, a second through hole that penetrates to a surface of the first substrate along at least part of the periphery of the vibration space when the first substrate is viewed in the plan view; and
forming a fourth metal in the second through hole.

17. The resonance device manufacturing method according to claim 16, wherein the second through hole has an annular shape when the first substrate is viewed in the plan view.

18. The resonance device manufacturing method according to claim 15, further comprising forming a titanium layer between the eutectic layer and the second substrate.

\* \* \* \* \*